(12) United States Patent
Sakaguchi

(10) Patent No.: US 9,698,361 B2
(45) Date of Patent: Jul. 4, 2017

(54) ORGANIC EL PANEL TRANSLUCENT SUBSTRATE, CONTROL METHOD FOR REFRACTIVE INDEX ANISOTROPY OF ORGANIC EL PANEL TRANSLUCENT SUBSTRATE, MANUFACTURING METHOD FOR ORGANIC EL PANEL TRANSLUCENT SUBSTRATE, ORGANIC EL PANEL, AND ORGANIC EL DEVICE

(71) Applicant: NEC LIGHTING, LTD., Tokyo (JP)

(72) Inventor: Yoshikazu Sakaguchi, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 13 days.

(21) Appl. No.: 14/668,181

(22) Filed: Mar. 25, 2015

(65) Prior Publication Data

US 2015/0280153 A1    Oct. 1, 2015

(30) Foreign Application Priority Data

Mar. 28, 2014  (JP) ................. 2014-070553

(51) Int. Cl.
*H01L 51/00* (2006.01)
*G02B 5/30* (2006.01)
*H01L 51/52* (2006.01)

(52) U.S. Cl.
CPC ...... *H01L 51/0097* (2013.01); *H01L 51/5275* (2013.01); *G02B 5/3083* (2013.01); *H01L 2251/5338* (2013.01); *Y02E 10/549* (2013.01); *Y02P 70/521* (2015.11)

(58) Field of Classification Search
CPC ............ H01L 51/0096; H01L 51/0097; H01L 51/5262; H01L 51/5275; H01L 2251/5338; G02B 5/3083; G02B 5/32; G02B 27/286; Y02E 10/549; Y02P 70/521
USPC ..................................... 359/489.07
See application file for complete search history.

(56) References Cited

U.S. PATENT DOCUMENTS

| RE40,787 E * | 6/2009 | Martin ................... B32B 27/08 428/411.1 |
| 8,619,363 B1 * | 12/2013 | Coleman ................. G02B 5/18 359/576 |
| 8,987,712 B2 * | 3/2015 | Saito .................. H01L 51/5231 257/40 |
| 2002/0159005 A1 * | 10/2002 | Arakawa .............. G02B 5/3016 349/96 |
| 2004/0100598 A1 * | 5/2004 | Adachi ............. G02F 1/133536 349/113 |
| 2005/0074564 A1 * | 4/2005 | Yamaoka ............. G02B 5/3016 428/1.1 |
| 2006/0154041 A1 * | 7/2006 | Hashimoto ....... G02F 1/133305 428/297.4 |
| 2006/0158076 A1 * | 7/2006 | Kondou ............... G02B 5/3083 313/110 |

(Continued)

FOREIGN PATENT DOCUMENTS

JP     2007-224270     9/2007

*Primary Examiner* — Frank Font
(74) *Attorney, Agent, or Firm* — Young & Thompson

(57) ABSTRACT

Disclosed is an organic EL panel translucent substrate that can prevent or reduce the color gap/coloring of an organic EL panel. In order to achieve the above object, organic EL panel translucent substrate 201 is formed of resins 203 and 204 and is substantially optically isotropic in its in-plane direction and thickness direction.

21 Claims, 7 Drawing Sheets

(56) References Cited

U.S. PATENT DOCUMENTS

| | | | | |
|---|---|---|---|---|
| 2007/0117485 A1* | 5/2007 | Sakata | ............... | B32B 17/04 |
| | | | | 442/180 |
| 2009/0015781 A1* | 1/2009 | Shimodaira | ............ | C08J 5/08 |
| | | | | 349/158 |
| 2010/0072422 A1* | 3/2010 | Parri | ............... | C09K 19/3059 |
| | | | | 252/299.61 |
| 2011/0025953 A1* | 2/2011 | Akao | ............... | G02B 5/3083 |
| | | | | 349/74 |
| 2012/0045625 A1* | 2/2012 | Omura | ............ | G02B 5/3083 |
| | | | | 428/195.1 |
| 2012/0302713 A1* | 11/2012 | Koike | ............ | C08J 5/18 |
| | | | | 526/283 |
| 2013/0277667 A1* | 10/2013 | Saito | ............ | H01L 51/5231 |
| | | | | 257/43 |
| 2014/0170345 A1* | 6/2014 | Aoshima | ............ | C08J 7/045 |
| | | | | 428/35.4 |

* cited by examiner

ORGANIC EL PANEL TRANSLUCENT SUBSTRATE, CONTROL METHOD FOR REFRACTIVE INDEX ANISOTROPY OF ORGANIC EL PANEL TRANSLUCENT SUBSTRATE, MANUFACTURING METHOD FOR ORGANIC EL PANEL TRANSLUCENT SUBSTRATE, ORGANIC EL PANEL, AND ORGANIC EL DEVICE

INCORPORATION BY REFERENCE

This application is based upon and claims the benefit of priority from Japanese patent application No. 2014-070553, filed on Mar. 28, 2014, the disclosure of which is incorporated herein in its entirety by reference.

EXPLANATION OF REFERENCE NUMERALS

Technical Field

The present invention relates to an organic EL panel translucent substrate, a control method for refractive index anisotropy of an organic EL panel translucent substrate, a manufacturing method for an organic EL panel translucent substrate, an organic EL panel, and an organic EL device.

Background Art

Organic EL elements used for organic EL (Electro-Luminescence) panels can be manufactured by forming organic EL material layers on translucent substrates.

As the translucent substrates for organic EL panels, sheet glasses such as a soda glass, an alkali-free glass, and the like have been used. In these years, the use of a resin film as the translucent substrate instead of the sheet glass is proposed (Patent Document 1 and the like). The use of a resin film as the translucent substrate has an advantage that the substrate can be bent easily and is unbreakable as compared to a sheet glass. Also the use of the resin film has an advantage in simplicity of the manufacturing process and mass productivity of organic EL elements and the reduction of manufacturing cost associated with the simplicity and mass productivity.

PRIOR ART DOCUMENTS

Patent Documents

Patent Document 1: JP 2007-224270 A

SUMMARY OF THE INVENTION

Problem to be Solved by the Invention

As the resin film for the translucent substrate, for example, polyethylene naphthalate (PEN), polyethylene terephthalate (PET), polyethersulfone (PES), polymethyl methacrylate (PMMA), polycarbonate (PC), and the like are used. However, since these materials have resin-specific refractive index anisotropy and the wavelength dependence thereof, the dependence occurs in a wavelength emitted from an oblique view and a color gap/coloring is likely to occur.

Patent Document 1 discloses a technique to reduce the in-plane retardation of a translucent substrate using a cyclic olefin thermoplastic resin such as a norbornene resin or the like. However, the translucent substrate disclosed in Patent Document 1 is not aimed to control the thickness direction retardation and also not aimed to prevent or reduce the color gap/coloring of an organic EL panel. There is a problem of causing the thickness direction retardation and the color gap/coloring by simply using a norbornene resin or the like disclosed in Patent Document 1.

Hence, the present invention is intended to provide an organic EL panel translucent substrate, a control method for refractive index anisotropy of an organic EL panel translucent substrate, a manufacturing method for an organic EL panel translucent substrate, an organic EL panel, and an organic EL device that can prevent or reduce the color gap/coloring of an organic EL panel.

Means for Solving Problem

In order to achieve the above object, the present invention provides a first organic EL panel translucent substrate formed of a resin, wherein the substrate is substantially optically isotropic in its in-plane direction and thickness direction.

The present invention also provides a second organic EL panel translucent substrate formed of a resin, wherein the substrate has refractive index anisotropy in at least one of its in-plane direction and thickness direction, and when the substrate is used for an organic EL panel, the whole organic EL panel becomes substantially optically isotropic in its in-plane direction and thickness direction.

The present invention also provides a control method for refractive index anisotropy of an organic EL panel translucent substrate controlling refractive index anisotropy of the resin in an organic EL panel translucent substrate formed of a resin to control refractive index anisotropy in an in-plane direction and a thickness direction of the organic EL panel translucent substrate.

The present invention also provides a manufacturing method for an organic EL panel translucent substrate, wherein refractive index anisotropy in an in-plane direction and a thickness direction of an organic EL panel translucent substrate is controlled by the control method for refractive index anisotropy of an organic EL panel translucent substrate according to the present invention.

The present invention also provides a third organic EL panel translucent substrate manufactured by the manufacturing method for an organic EL panel translucent substrate of the present invention.

The present invention also provides an organic EL panel including one of the first to third organic EL panel translucent substrates of the present invention (hereinafter, they may be collectively referred to as the "organic EL panel translucent substrate of the present invention").

The present invention also provides an organic EL device including the organic EL panel translucent substrate of the present invention or the organic EL panel of the present invention.

Effects of the Invention

According to the organic EL panel translucent substrate, the control method for refractive index anisotropy of an organic EL panel translucent substrate, the manufacturing method for an organic EL panel translucent substrate, the organic EL panel, and the organic EL device of the present invention, it is possible to prevent or reduce the color gap/coloring of an organic EL panel.

DESCRIPTION OF EMBODIMENTS

Figure 1:
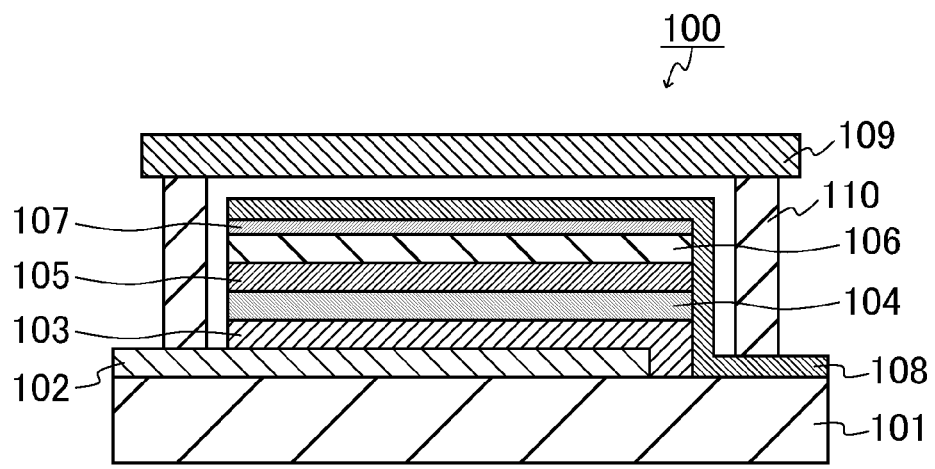
FIG. 1 is a cross sectional view schematically showing an example of the structure of an organic EL panel of the present invention.

Hereinafter, the present invention will be described in detail with examples. However, the present invention is not limited by the following description. In the drawings, for convenience in explanation, the structures of the respective components may be appropriately simplified, and the dimensions and the like of the respective components may be schematically described and they may be different from the actual dimensions and the like.

Embodiment 1

The first organic EL panel translucent substrate of the present invention is, as described above, characterized in that the substrate is formed of a resin and is substantially optically isotropic in its in-plane direction and thickness direction. The second organic EL panel translucent substrate of the present invention is, as described above, characterized in that the substrate is formed of a resin and has refractive index anisotropy in at least one of its in-plane direction and thickness direction, and when the substrate is used for an organic EL panel, the whole organic EL panel becomes substantially optically isotropic in its in-plane direction and thickness direction. The third organic EL panel translucent substrate of the present invention is, as described above, characterized in that the substrate is manufactured by the manufacturing method for an organic EL panel translucent substrate of the present invention. That is, in the third organic EL panel translucent substrate of the present invention, the refractive index anisotropy in the in-plane direction and thickness direction is controlled by the control method for refractive index anisotropy of an organic EL panel translucent substrate of the present invention.

Generally, an organic EL element is a self-light-emitting device and does not utilize birefringence or optical activity. Therefore, the viewing angle of the light-emitting device itself is wide. Thus, in the organic EL element, there is less need to expand the viewing angle using a retardation film or the like. Furthermore, as long as a glass substrate having low refractive index anisotropy is used for an organic EL panel translucent substrate, a color gap depending on the viewing angle is small. Therefore also in an organic EL panel and an organic EL device that use translucent substrates formed of resins, the birefringence of the translucent substrate has received less attention.

The inventors of the present invention focused attention on the control of the refractive index anisotropy in the in-plane direction and thickness direction of the translucent substrate. For example, when a translucent substrate that is substantially optically isotropic (the refractive index anisotropy does not substantially exist) in its in-plane direction and thickness direction is used, the in-plane retardation and thickness direction retardation of the substrate are reduced. This makes it possible to solve the problem of color gap/coloring depending on a viewing angle, a wavelength, and the like, for example.

The cross sectional view of FIG. 1 schematically shows an example of the structure of an organic EL panel of the present invention that uses an organic EL panel translucent substrate of the present invention. As shown in FIG. 1, in organic EL panel 100, anode (transparent electrode) 102 formed of indium tin oxide (ITO), hole injection layer 103, hole transport layer 104, light-emitting layer 105, electron transport layer 106, electron injection layer 107, and cathode 108 are laminated in this order on one side of organic EL panel translucent substrate (hereinafter, may simply be referred to as a "translucent substrate") 101 of the present invention. One end of cathode 108 is protruded and is in contact with one end of each of hole injection layer 103, hole transport layer 104, light-emitting layer 105, electron transport layer 106, and electron injection layer 107. The protruded end of cathode 108 is in contact with one side of translucent substrate 101 in such a manner that it is not in contact with and separated from anode 102. Both ends of each of hole injection layer 103, hole transport layer 104, light-emitting layer 105, electron transport layer 106, and electron injection layer 107 are enclosed with sealing part 110. One end (right side end in FIG. 1) of cathode 108 and one end (left side end in FIG. 1) of anode 102 on the opposite side are protruded to the outside of sealing part 110 in the state where they are sandwiched between sealing part 110 and translucent substrate 101. The protruded parts of cathode 108 and anode 102 each can be connected to a power supply or the like (not shown) provided outside the device. On the top surface of sealing part 110 (opposite side to translucent substrate 101), sealing film (counter film) 109 is attached in such a manner that it encloses hole injection layer 103, hole transport layer 104, light-emitting layer 105, electron transport layer 106, and electron injection layer 107 and is opposed to translucent substrate 101. In this manner, hole injection layer 103, hole transport layer 104, light-emitting layer 105, electron transport layer 106, and electron injection layer 107 are enclosed and sealed by translucent substrate 101, sealing film 109, and sealing part 110.

In the organic EL panel of FIG. 1, since translucent substrate 101 and anode 102 are transparent (translucent), light emitted from light-emitting layer 105 can be extracted from the side of translucent substrate 101 and anode 102 (lower side in FIG. 1).

Organic EL panel 100 of FIG. 1 is manufactured, for example, as follows. That is, first, organic EL panel translucent substrate 101 of the present invention is provided. This translucent substrate 101 may be a flexible transparent substrate (film substrate), for example. Next, a transparent conductive film is formed of a transparent conductive material (transparent electrode material) by a sputtering method, a chemical vapor deposition (CVD) method, or the like, and the transparent conductive film thus formed is used as anode (transparent electrode) 102. As the transparent conductive material (transparent electrode material), indium tin oxide (ITO), indium zinc oxide (IZO), tin oxide, and the like can be used.

Next, hole injection layer 103 is formed on anode 102. The hole injection layer lowers the level of an injection barrier to a hole injected from a transparent electrode (translucent electrode) layer, which is an anode, to an organic layer, for example. Also the hole injection layer eases the difference in the energy level between an anode and a hole transport layer to allow the easy injection of a hole injected from the anode to the hole transport layer, for example. Examples of the material for forming the hole injection layer include copper phthalocyanine and arylamine derivatives such as starburst type aromatic amine and the like. These materials may be chemically doped with an inorganic matter such as vanadium pentoxide, molybdenum trioxide, or the like or an organic matter such as F4-TCNQ or the like to further lower the level of the injection barrier and the drive voltage.

Then, hole transport layer 104 is formed on hole injection layer 103. Preferably, the hole transport layer is formed of a hole transport layer material that has right amount of ionization potential for increasing the hole mobility to a light-emitting layer and, at the same time, has an electron affinity for preventing the leak of an electron from the light-emitting layer. Examples of the material for forming the hole transport layer include triphenyldiamines such as bis(di(p-tolyl) aminophenyl)-1,1-cyclohexane, TPD, N,N'-diphenyl-N—N-bis(1-naphthyl)-1,1'-biphenyl)-4,4'-diamine (α-NPD), and the like and starburst type aromatic amine.

Then, light-emitting layer 105 is formed on hole transport layer 104. The light-emitting layer recombines electrons and holes injected from electrodes to emit fluorescence, phosphorescence, or the like. Examples of the material for forming the light-emitting layer include low-molecular weight compounds such as tris(8-quinolinol) aluminum complex ($Alq_3$), bis diphenyl vinyl biphenyl (BDPVBi), 1,3-bis(p-t-butylphenyl-1,3,4-oxadiazolyl)phenyl (OXD-7), N,N'-bis(2,5-di-t-butylphenyl) perylenetetracarboxylic diimide (BPPC), 1,4bis(N-p-tolyl-N-4-(4-methyl styryl) phenylamino) naphthalene, and the like and high-molecular weight compounds such as a polyphenylene vinylene polymer and the like.

As the light-emitting material, a two-component material including a host and a dopant can be used. In the two-component type light-emitting material, excited-state energy generated in a host molecule is transferred to a dopant molecule to cause the dopant molecule to emit light. As the two-component type light-emitting material, for example, the above-described light-emitting materials, electron transport materials, and hole transport materials can be used. Specific examples thereof include materials obtained by doping hosts with dopants according to the following combinations:

Host: a quinolinol metal complex such as $Alq_3$ or the like
Dopant: a pyran derivative such as 4-dicyanomethylene-2-methyl-6-(p-dimethylaminostyryl)-4H-pyran (DCM), 2,3-quinacridone, or the like or a coumarin derivative such as 3-(2'-benzothiazole)-7-diethylaminocoumarin or the like;
Host: an electron transport material bis(2-methyl-8-hydroxyquinoline)-4-phenylphenol-aluminum complex
Dopant: a condensed polycyclic aromatic compound such as perylene or the like;
Host: a hole transport layer material 4,4'-bis(m-tolylphenylamino)biphenyl (TPD) Dopant: rubrene or the like; and
Host: a carbazole compound such as 4,4'-biscarbazolylbiphenyl (CBP), 4,4'-bis(9-carbazolyl)-2,2'-dimethylbiphenyl (CDBP), or the like Dopant: a platinum complex or a iridium complex such as tris-(2phenylpyridine) iridium complex ($Ir(ppy)_3$), (bis(4,6-di-fluorophenyl)-pyridinate-N,C2') picolinate iridium complex (FIr(pic)), (bis(2-(2'-benzo(4,5-α) thienyl)pyridinate-N,C2')(acetylacetonate) iridium complex ($Btp_2Ir(acac)$), $Ir(pic)_3$, $Bt_2Ir(acac)$, or the like.

These light-emitting materials can be selected according to a desired color of the light to be emitted from an organic EL device, for example. Specific examples of the selection are as follows:
in the case of green light emission:
Host: $Alq_3$
Dopant: quinacridone, coumarin, Ir $(ppy)_3$, or the like;
in the case of blue light emission:
Host: DPVBi
Dopant: perylene, a distyrylallylene derivative, FIr(pic), or the like;
in the case of green to blue-green light emission:
Host: $Alq_3$
Dopant: OXD-7 or the like;
in the case of red to orange light emission:
Host: $Alq_3$
Dopant: DCM, DCJTB, $Ir(pic)_3$, or the like; and
in the case of yellow light emission:
Host: $Alq_3$
Dopant: rubrene, $Bt_2Ir(acac)$ or the like.
Also, for obtaining the white light emission, the following combination of a host and a guest can be employed as the light-emitting material:
Host: $Alq_3$ or the like
Guest: DCM (orange) or the like.

The light-emitting layer of emitting white light may have a three-layer structure in which the layers respectively contain light-emitting materials emitting red, green, and blue; a two-layer structure in which the layers respectively contain light-emitting materials emitting complementary colors such as blue and yellow, and the like; or a one-layer structure formed using the light-emitting materials of the respective colors by multiple co-evaporation or the like so that the light-emitting materials of the respective colors are mixed therein. Furthermore, a layer obtained by planarly aligning, in order, fine pixels of red, blue, green, and the like of the light-emitting materials that form the respective layers in the three-layer structure and the two-layer structure may be used as the light-emitting layer.

Then, electron transport layer 106 is formed on light-emitting layer 105. Preferably, the electron transport layer is formed of an electron transport layer material that has right amount of ionization potential for increasing the electron mobility to a light-emitting layer and, at the same time, has an electron affinity for preventing the leak of a hole from the light-emitting layer. Examples of the material for forming the electron transport layer include organic materials such as oxadiazole derivatives such as 2-(4-biphenylyl)-5-(4-t-butylphenyl)-1,3,4-oxadiazole (Bu-PBD), OXD-7, and the like; triazole derivatives; quinolinol metal complexes; and the like. Furthermore, materials obtained by chemically doping these organic materials with electron-donating substances such as alkali metals such as lithium and the like may be used.

Although not shown in FIG. 1, for blocking a hole passing through the light-emitting layer without involving in light emission and increasing the recombination probability in the light-emitting layer, a hole-blocking layer may be provided between the light-emitting layer and the electron transport layer. As the hole-blocking layer, 2,9-dimethyl-4,7-diphenyl-1,10-phenanthroline (BCP), triphenyldiamine derivatives, triazole derivatives, and the like can be used.

Furthermore, electron injection layer 107 may be formed on electron transport layer 106. The electron injection layer is provided to ease the difficulty in electron injection from a cathode to an electron transport layer due to a great difference in energy between the work function of a metal material such as aluminum or the like used for forming an electrode layer, which is a cathode, and the electron affinity (LUMO level) of the electron transport layer, for example. As the material for forming an electron injection layer, a material with a low work function selected from the group including fluorides and oxides of alkali metals such as lithium, cesium, and the like and alkali earth metals such as calcium and the like; magnesium-silver; and lithium aluminum alloy can be used.

As to the thicknesses of an organic layer (hole injection layer 103, hole transport layer 104, light-emitting layer 105, electron transport layer 106, and electron injection layer 107 in FIG. 1) provided between the electrodes (between anode 102 and cathode 108), for example, the thickness of each layer may be in the range from 1 nm to 500 nm and the thickness of the total of the respective layers is in the range from 100 nm to 1000 nm The organic layer-forming material (photosensitive coloring composition) may be applied after dissolving it in an organic solvent, for example. The organic solvent is not particularly limited, and examples thereof include cyclohexanone, butylcellosolve, propylene glycol monomethyl ether acetate (PEGMEA), propylene glycol monomethyl ether (PEGME), ethyl-3-ethoxypropionate (EEP), diethylene glycol dimethyl ether (MEC), methoxypropyl acetate, ethyl acetate, n-butyl acetate, 3-methoxybutyl acetate, and the like. One of the organic solvents may used alone or two or more of them may be used in combination.

Then, cathode 108 is formed. In FIG. 1, since anode 102 and substrate 101 are transparent (translucent), light can be extracted from the side of the anode 102 and the substrate 101. Therefore, cathode 108 is not necessarily transparent (translucent). The cathode is preferably formed as a light-proof cathode such as a metal thin film such as aluminum, silver, or the like, for example, because it allows the light emitted from the organic layer to be reflected to the anode (translucent electrode) layer side and suppresses the decrease in the amount of emitting light from a light emitting surface. The thickness of each of the electrode layers (anode and cathode) is preferably thick in consideration of the voltage drop due to the wiring resistance, and can be, for example, in the range from 50 nm to 300 nm. Also, the cathode may be formed of the transparent conductive material (transparent electrode material). In this case, an organic EL element that becomes transparent when it is not emitting light can be manufactured. Furthermore, as shown in FIG. 1 for example, it is preferable to extend an end of the electrode layer for forming a connection part with a wiring member.

Then, sealing part 110 and sealing film 109 are provided to seal the organic layer in the manner as described above. In this manner, the organic EL panel shown in FIG. 1 can be manufactured.

Note that the structure of FIG. 1 is illustrative, and an organic EL panel of the present invention is not limited by FIG. 1 by any means. For example, the structure and the material of the organic EL panel of the present invention may be the same as or according to the structure and the material of a common organic EL panel except that the organic EL panel translucent substrate of the present invention is used as a translucent substrate. Also, the manufacturing method for an organic EL panel is not particularly limited and may be the same as or according to the manufacturing method of a common organic EL panel except that the organic EL panel translucent substrate of the present invention is used as a translucent substrate. For example, while the organic layer provided on a transparent electrode (translucent electrode) layer, which is an anode, includes hole injection layer 103, hole transport layer 104, light-emitting layer 105, electron transport layer 106, and electron injection layer 107 in FIG. 1, the present invention is not limited thereto. For example, the organic layer may include plural layers such as a light-emitting layer that contains an organic electroluminescence substance, a hole transport layer and an electron transport layer that sandwich the light-emitting layer, a hole injection layer and an electron injection layer that sandwich the hole transport layer and the electron transport layer, a carrier-blocking layer that blocks a hole or an electron and improves the luminous efficiency, and the like. Furthermore, for example, the method for forming the organic layer is not particularly limited and can be any method including a vacuum evaporation method, an application method, or the like.

Also, the organic EL panel shown in FIG. 1 has a structure in which emitted light is extracted from one side (the lower side in FIG. 1). However, the organic EL panel of the present invention is not limited thereto and may have a structure of a double-sided light emitting type in which light can be extracted from both sides. In the case of a double-sided light emitting type organic EL panel, for example, it is preferable to use a transparent electrode (for example, ITO) also for a cathode (cathode 108 in FIG. 1). In this case, for example, it is preferable to use the organic EL panel translucent substrates of the present invention at both sides. Specifically, for example, it is preferable to use the organic EL panel translucent substrate of the present invention also for a sealing film (sealing film 109 in FIG. 1) at the cathode side.

Furthermore, by using a transparent electrode for a cathode, there may be no cathode reflection of emitted light. Since this allows the wavelength dependence of the optical orientation due to light reflected or waveguided in an organic EL panel, the film thickness interference, and the like to be reduced, a color gap can further be reduced. Also, for example, the same effect can be obtained by using the organic EL panel translucent substrate of the present invention for a sealing film at the cathode side.

Furthermore, the organic EL device of the present invention is also not particularly limited, and, for example, may be the same as or according to a common organic EL device except that it includes the organic EL panel translucent substrate of the present invention or the organic EL panel of the present invention.

FIG. 2(a) schematically shows the state of a first organic EL panel translucent substrate of the present invention when light is transmitted. As shown in FIG. 2(a), organic EL panel translucent substrate 201 includes transparent resin film 202. Translucent substrate 201 (resin film 202) is formed of polymer (resin) molecules 203 and 204 and is substantially optically isotropic in the in-plane direction and thickness direction as a whole (the refractive index anisotropy in the in-plane direction and thickness direction does not substantially exist). Note that polymer molecules 203 and 204 are not particularly limited and, for example, may be polymer molecules having positive birefringence or polymer molecules having negative birefringence as will be described in the following embodiments.

In translucent substrate 201 of FIG. 2(a), incident light 205 from the front direction (the direction perpendicular to the substrate plane) is transmitted through translucent substrate 201 to be transmitted light 205a. Incident light 206 and 207 from diagonal directions (directions diagonal to the direction perpendicular to the substrate plane) is transmitted through translucent substrate 201 to be transmitted light 206a and 207a. As shown in FIG. 2(a), there is no color tone change (color gap/coloring) depending on the angle of incident light and the angle of emission light (i.e., viewing angle) in transmitted light 205a, 206a and 207a. This is because the substrate is substantially optically isotropic (the refractive index anisotropy does not substantially exist) in its in-plane direction and thickness direction.

Refractive index ellipsoid 213 shown in FIG. 2(b) is the refractive index ellipsoid of frontward transmitted light 205a. Refractive index ellipsoid 223 shown in FIG. 2(c) is the refractive index ellipsoid of diagonally transmitted light 206a or 207a. As shown in FIGS. 2(b) and (c), since the substrate is substantially optically isotropic (the refractive index anisotropy does not substantially exist) in its in-plane direction and thickness direction, the refractive index ellipsoids of the frontward transmitted light and the diagonally transmitted light are each nearly a circle. As shown in FIG. 2(b), the refractive index ellipsoid 213 of frontward transmitted light 205a may be the synthesis of refractive index ellipsoid 211 and refractive index ellipsoid 212. As shown in FIG. 2(c), refractive index ellipsoid 223 of diagonally transmitted light 206a or 207a may be the synthesis of refractive index ellipsoid 221 and refractive index ellipsoid 222. Note that the syntheses of these refractive index ellipsoids are illustrative and do not limit the present invention by any means.

Figure 11:
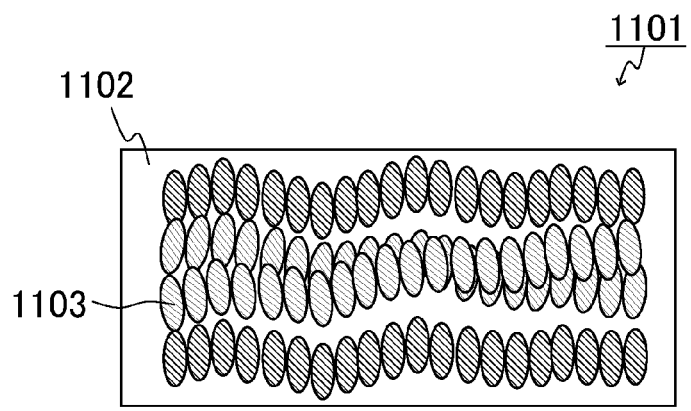
FIG. 11 is a cross sectional view schematically showing an example of an organic EL panel translucent substrate having refractive index anisotropy.
Figure 12:
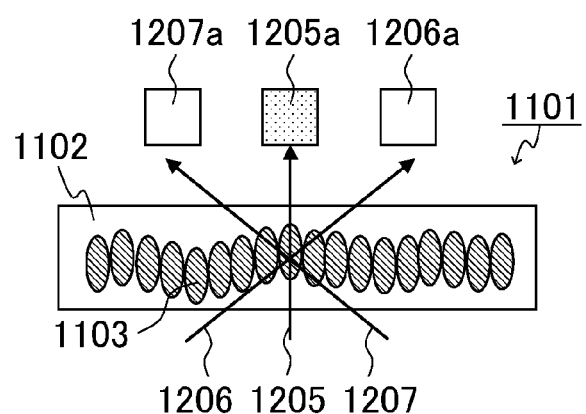
FIG. 12 is a diagram schematically showing the state of organic EL panel translucent substrate 1101 of FIG. 11 when light is transmitted.
Figure 12:
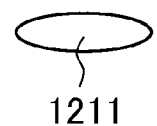
Figure 12:
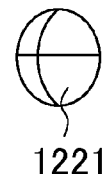

The cross sectional view of FIG. 11 schematically shows an example of an organic EL panel translucent substrate having refractive index anisotropy. As shown in FIG. 11, organic EL panel translucent substrate 1101 includes resin film 1102. Resin film 1102 is formed of resin 1103. Translucent substrate (resin film) 1102 has refractive index anisotropy. Note that in FIG. 11, for viewability, hatching is not given to resin film 1102. The same applies to the other cross sectional views. FIG. 12 schematically shows the state of organic EL panel translucent substrate 1101 of FIG. 11 when light is transmitted. As shown in FIG. 12, incident light 1205 from the front direction (the direction perpendicular to the substrate plane) is transmitted through translucent substrate 1101 to be transmitted light 1205a. Incident light 1206 and 1207 from diagonal directions (directions diagonal to the direction perpendicular to the substrate plane) is transmitted through translucent substrate 1101 to be transmitted light 1206a and 1207a. As shown in FIG. 12, there is a color tone change (color gap/coloring) depending on the angle of incident light and the angle of emission light (i.e., viewing angle) in frontward transmitted light 205a with respect to diagonally transmitted light 206a and 207a. This is because the refractive index anisotropy exists in translucent substrate 1101. A schematic illustration of the refractive index ellipsoid of frontward transmitted light 205a includes, for example, refractive index ellipsoid 1211 of FIG. 12(b). A schematic illustration of the refractive index ellipsoid of transmitted light 1206a and 1207a includes, for example, refractive index ellipsoid 1221 of FIG. 12(c).

The organic EL panel translucent substrate of the present invention may be a translucent substrate (the first organic EL panel translucent substrate of the present invention) that is substantially optically isotropic in its in-plane direction and thickness direction (the refractive index anisotropy in the in-plane direction and thickness direction does not substantially exist in the substrate) as described with reference to FIG. 2, for example. Also the organic EL panel translucent substrate of the present invention may be a translucent substrate (the second organic EL panel translucent substrate of the present invention) having refractive index anisotropy in at least one of the in-plane direction and thickness direction. This makes it possible, even in the case where members having a variety of birefringence are used for an organic EL panel or an organic EL panel has a property of having birefringence, to cancel the birefringence by the birefringence of the translucent substrate of the present invention (i.e. this allows the refractive index anisotropy in the in-plane direction and thickness direction of the substrate not to substantially exist in the organic EL panel). Furthermore, the organic EL panel translucent substrate of the present invention is not limited to the above-described substrates and may be, for example, a translucent substrate (the third organic EL panel translucent substrate of the present invention) in which the refractive index anisotropy in the in-plane direction and thickness direction is freely controlled by the control method for refractive index anisotropy of an organic EL panel translucent substrate of the present invention. This makes it possible to emit light of different colors by controlling the optical orientation utilizing the retardation of the organic EL panel translucent substrate and the interference due to the film thickness, for example.

Note that in the organic EL panel translucent substrate of the present invention, "the substrate is substantially optically isotropic in its in-plane direction and thickness direction (the refractive index anisotropy in the in-plane direction and thickness direction does not substantially exist in the substrate)" is meant to satisfy at least one of the following conditions (A) to (E). Also, in the organic EL panel of the present invention, "the organic EL panel is substantially optically isotropic in the in-plane direction and thickness direction (the refractive index anisotropy in the in-plane direction and thickness direction does not substantially exist)" is meant to satisfy at least one of the following conditions (A') to (E').

[Condition (A)]

With respect to light having a wavelength of 550 nm incident from a direction perpendicular to the in-plane direction of the organic EL panel translucent substrate, in-plane retardation Rip represented by the following equation (I) is 30 nm or less and thickness direction retardation Rth represented by the following equation (II) is 80 nm or less.

$$Rip = (nx - ny) \cdot d \qquad (I)$$

$$Rth = \{(nx + ny)/2 - nz\} \cdot d \qquad (II)$$

In equations (I) and (II), nx, ny, and nz respectively represent refractive indices in an X-axis direction, a Y-axis direction, and a Z-axis direction in the organic EL panel translucent substrate. The X-axis direction is an axial direction in which the in-plane refractive index of the organic EL panel translucent substrate is the greatest, the Y-axis direction is an axial direction that is perpendicular to the X-axis direction in the plane, and the Z-axis direction is a thickness direction that is perpendicular to the X axis and the Y axis.

Furthermore, in equations (I) and (II), d represents a thickness (nm) of the organic EL panel translucent substrate.

In condition (A), the in-plane retardation Rip is preferably 20 nm or less, more preferably 18 nm or less, still more preferably 10 nm or less, and particularly preferably 5 nm or less. The lower limit of the in-plane retardation Rip is, for example, 1 nm or more although it is not particularly limited. The in-plane retardation Rip is ideally 0 nm. In condition (A), the thickness direction retardation Rth is preferably 60 nm or less, more preferably 40 nm or less, and particularly preferably 20 nm or less. The lower limit of the thickness direction retardation Rth is, for example, 2 nm or more although it is not particularly limited. The thickness direction retardation Rth is ideally 0 nm.

In condition (A), the method and apparatus for measuring the in-plane retardation $\Delta$nd and the thickness direction retardation Rth are not particularly limited and, for example, the in-plane retardation $\Delta$nd and the thickness direction retardation Rth can be measured using measuring instruments such as KOBRA (product name) produced by Oji Scientific Instruments, Exicor (product name) produced by HINDS Instruments that uses a photoelastic modulator, and the like. Also, by measuring nx, ny and nz in equations (I) and (II) by a spectroscopic ellipsometer, the in-plane retardation Rip and the thickness direction retardation Rth can be calculated based on the measured values of nx, ny and nz and the thickness d of the organic EL panel translucent substrate.

[Condition (B)]

With respect to light having a wavelength of 550 nm incident from a direction at an angle of 45° to the in-plane direction of the organic EL panel translucent substrate, a numerical value (Rth/Rip) obtained by dividing the Rth represented by equation (II) by the Rip represented by equation (I) is 5.0 or less.

The numerical value of Rth/Rip (the ratio between Rth and Rip) is preferably small (close to 1), because a color gap and coloring tend to be small when the numerical value of Rth/Rip is small. The numerical value of Rth/Rip is preferably 3.5 or less and particularly preferably 3.0 or less. The lower limit of the numerical value of Rth/Rip is, for example, 1.0 or more although it is not particularly limited.

[Condition (C)]

With respect to light incident from a direction perpendicular to the in-plane direction of the organic EL panel translucent substrate,
the in-plane retardation Rip represented by equation (I) in a wavelength range from 380 to 780 nm to the Rip at a wavelength of 550 nm is in a range from 95 to 110% (ratio is in a range from 0.95 to 1.10), and
the thickness direction retardation Rth represented by equation (II) in a wavelength range from 380 to 780 nm to the Rth at a wavelength of 550 nm is in a range from 90 to 115% (ratio is in a range from 0.90 to 1.15).

In condition (C), the wavelength dispersion of the in-plane retardation Rip in the wavelength range from 380 to 780 nm to the Rip at the wavelength of 550 nm is preferably in the range from 95 to 110%, more preferably in the range from 98 to 105%, and particularly preferably in the range from 99 to 103%. In condition (C), the wavelength dispersion of the thickness direction retardation Rth in the wavelength range from 380 to 780 nm to the Rth at the wavelength of 550 nm is preferably in the range from 90 to 115%, more preferably in the range from 95 to 110%, and particularly preferably in the range from 98 to 105%.

In condition (C), the method and apparatus for measuring the in-plane retardation $\Delta$nd and the thickness direction retardation Rth are not particularly limited and, for example, the in-plane retardation $\Delta$nd and the thickness direction retardation Rth can be measured using KOBRA (product name) produced by Oji Scientific Instruments.

[Condition (D)]

At the same measurement wavelength, a luminance at an angle in a range from 2 to 90° (more preferably from 0 to 90°) to the in-plane direction of the organic EL panel translucent substrate to a luminance at an angle of 90° to the in-plane direction of the organic EL panel translucent substrate is in a range from 85 to 110%, and
a chromaticity change $\Delta$u' v' at an angle in a range from 2 to 90° (more preferably from 0 to 90°) to the in-plane direction of the organic EL panel translucent substrate is in a range from 0 to 0.02, provided that
the measurement wavelength is in a range from 380 to 780 nm In condition (D), the luminance at the angle in the range from 2 to 90° (more preferably from 0 to 90°) to the in-plane direction of the organic EL panel translucent substrate to the luminance at the angle of 90° to the in-plane direction of the organic EL panel translucent substrate is preferably in the range from 85 to 110%, more preferably in the range from 90 to 105%, and particularly preferably in the range from 98 to 100%. The chromaticity change is $\Delta$u' v', and is preferably in the range from 0 to 0.020, more preferably in the range from 0 to 0.015, and particularly preferably in the range from 0 to 0.010%. In condition (D), the method and apparatus for measuring the luminance and chromaticity and the chromaticity change are not particularly limited and, for example, the luminance and chromaticity and the chromaticity change can be measured using EZ contrast (product name) produced by ELDIM. Note that condition (D) represents the state in which there is substantially no (no or little) viewing angle dependence of luminance and chromaticity. Also, qualitatively, the viewing angle dependence of luminance and chromaticity can be measured by a cross-Nicol method in which a sample is measured and observed in a state where it is sandwiched between two polarizers orthogonal to each other, for example.

[Condition (E)]

At an angle in a range from 2 to 90° (more preferably from 0 to 90°) to the in-plane direction of the organic EL panel translucent substrate,
in a case where the angle is the same, the Rip and the Rth in a wavelength range from 380 to 780 nm to the Rip and the Rth at a wavelength of 550 nm are respectively in a range from 90 to 120%.

In condition (E), the retardation Rip and Rth measured in the direction at the angle of 90° to the in-plane direction (i.e., the front direction to the substrate) and in the direction at the angle of 0° to the in-plane direction in the wavelength range from 380 to 780 nm to the Rip and the Rth at the wavelength of 550 nm are respectively preferably in a range from 90 to 115%, more preferably in the range from 95 to 110%, and particularly preferably in the range from 98 to 105%. In condition (E), the method and apparatus for measuring the retardation Rip and Rth are not particularly limited and, for example, the retardation Rip and Rth can be measured using KOBRA (product name) produced by Oji Scientific Instruments and the like. Note that condition (E) represents the state in which there is substantially no (no or little) wavelength dependence of luminance and chromaticity. Also, qualitatively, the wavelength dependence of luminance and chromaticity can be measured by a cross-Nicol method in which a sample is measured and observed in a state where it is sandwiched between two polarizers orthogonal to each other, for example.

In the present invention, preferably, the organic EL panel is substantially optically isotropic in the in-plane direction and thickness direction (the refractive index anisotropy in the in-plane direction and thickness direction does not substantially exist). More preferably, the organic EL panel satisfies at least one of the following conditions (A') to (E'). In conditions (A') to (E'), the measurement method can be the same as those described for conditions (A) to (E), for example.

[Condition (A')]

With respect to light having a wavelength of 550 nm incident from a direction perpendicular to the in-plane direction of the organic EL panel, in-plane retardation Rip' represented by the following equation (I') is 30 nm or less and thickness direction retardation Rth' represented by the following equation (II') is 80 nm or less.

$$Rip'=(nx'-ny')\cdot d' \qquad (I')$$

$$Rth'=(nx'+ny')/2-nz')\cdot d' \qquad (II')$$

In equations (I') and (II'), nx', ny', and nz' respectively represent refractive indices in an X-axis direction, a Y-axis direction, and a Z-axis direction in the organic EL panel. The X-axis direction is an axial direction in which the in-plane refractive index of the organic EL panel is the greatest, the Y-axis direction is an axial direction that is perpendicular to the X-axis direction in the plane, and the Z-axis direction is a thickness direction that is perpendicular to the X axis and the Y axis.

Furthermore, in equations (I') and (II'), d' represents a thickness (nm) of the organic EL panel.

In condition (A'), the in-plane retardation Rip' is preferably 20 nm or less, more preferably 18 nm or less, still more preferably 10 nm or less, and particularly preferably 5 nm or less. The lower limit of the in-plane retardation Rip' is, for example, 1 nm or more although it is not particularly limited. The in-plane retardation Rip' is ideally 0 nm. In condition (A'), the thickness direction retardation Rth' is preferably 60 nm or less, more preferably 40 nm or less, and particularly preferably 20 nm or less. The lower limit of the thickness direction retardation Rth' is, for example, 2 nm or more although it is not particularly limited. The thickness direction retardation Rth' is ideally 0 nm

[Condition (B')]

With respect to light having a wavelength of 550 nm incident from a direction at an angle of 45° to the in-plane direction of the organic EL panel, a numerical value (Rth'/Rip') obtained by dividing the Rth' represented by equation (II') by the Rip' represented by equation (I') is 5.0 or less.

The numerical value of Rth'/Rip' (the ratio between Rth' and Rip') is preferably small (close to 1), because a color gap and coloring tend to be small when the numerical value of Rth'/Rip' is small. The numerical value of Rth'/Rip' is preferably 3.5 or less and particularly preferably 3.0 or less. The lower limit of the numerical value of Rth'/Rip' is, for example, 1.0 or more although it is not particularly limited.

[Condition (C')]

With respect to light incident from a direction perpendicular to the in-plane direction of the organic EL panel, the in-plane retardation Rip' represented by equation (I') in a wavelength range from 380 to 780 nm to the Rip' at a wavelength of 550 nm is in a range from 95 to 110% (ratio is in a range from 0.95 to 1.10), and the thickness direction retardation Rth' represented by equation (II') in a wavelength range from 380 to 780 nm to the Rth' at a wavelength of 550 nm is in a range from 90 to 115% (ratio is in a range from 0.90 to 1.15).

In condition (C'), the wavelength dispersion of the in-plane retardation Rip' in the wavelength range from 380 to 780 nm to the Rip' at the wavelength of 550 nm is preferably in the range from 95 to 110%, more preferably in the range from 98 to 105%, and particularly preferably in the range from 99 to 103%. In condition (C'), the wavelength dispersion of the thickness direction retardation Rth' in the wavelength range from 380 to 780 nm to the Rth' at the wavelength of 550 nm is preferably in the range from 90 to 115%, more preferably in the range from 95 to 110%, and particularly preferably in the range from 98 to 105%.

[Condition (D')]

At the same measurement wavelength, a luminance at an angle in a range from 2 to 90° (more preferably from 0 to 90°) to the in-plane direction of the organic EL panel to a luminance at an angle of 90° (more preferably from 0 to 90°) to the in-plane direction of the organic EL panel is in a range from 85 to 110%, and a chromaticity change Δu'v' at an angle in a range from 2 to 90° (more preferably from 0 to 90°) to the in-plane direction of the organic EL panel is in a range from 0 to 0.02, provided that the measurement wavelength is in a wavelength range from 380 to 780 nm In condition (D'), the luminance at the angle in the range from 2 to 90° (more preferably from 0 to 90°) to the in-plane direction to the luminance at the angle of 90° to the in-plane direction is preferably in the range from 85 to 110%, more preferably in the range from 90 to 105%, and particularly preferably in the range from 98 to 100%. The chromaticity change is Δu'v', and is preferably in the range from 0 to 0.020, more preferably in the range from 0 to 0.015, and particularly preferably in the range from 0 to 0.010%.

[Condition (E')]

At an angle in a range from 2 to 90° (more preferably from 0 to 90°) to the in-plane direction of the organic EL panel, in a case where the angle is the same, a luminance/luminosity factor (a numerical value obtained by dividing a luminance by a luminosity factor) in a wavelength range from 380 to 780 nm to the luminance/luminosity factor at a wavelength of 550 nm is in a range from 85 to 110%.

In condition (E'), in the case where the angle is the same, the luminance/luminosity factor (the numerical value obtained by dividing a luminance by a luminosity factor) in the wavelength range from 380 to 780 nm to the luminance/luminosity factor at the wavelength of 550 nm is preferably in the range from 90 to 115%, more preferably in the range from 95 to 110%, and particularly preferably in the range from 98 to 105%.

Figure 8:
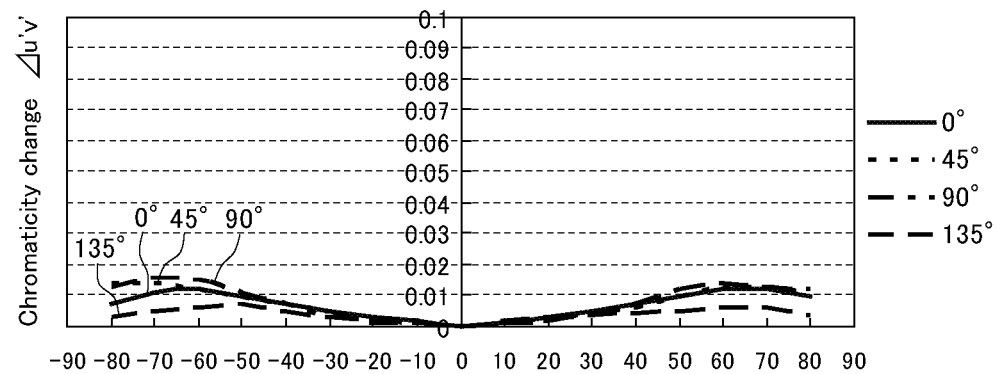
FIG. 8 is a graph showing an example of the chromaticity change of an organic EL panel that uses a first organic EL panel translucent substrate of the present invention.
Figure 9:
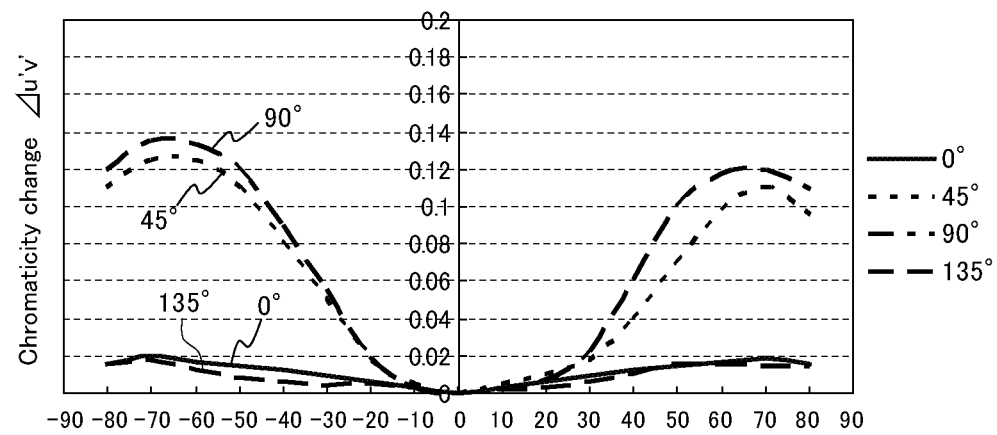
FIG. 9 is a graph showing an example of the chromaticity change of an organic EL panel that uses an organic EL panel translucent substrate having refractive index anisotropy.
Figure 10A:
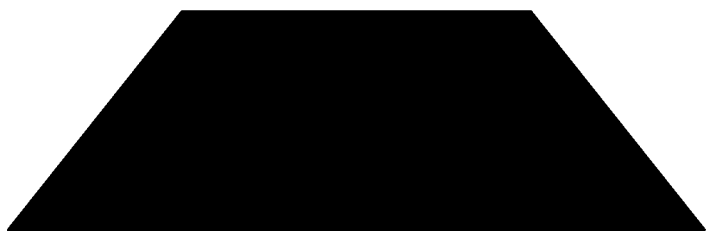
FIG. 10A shows an example of a display in the case where an organic EL panel that uses an organic EL panel translucent substrate of the present invention is viewed diagonally.
Figure 10B:
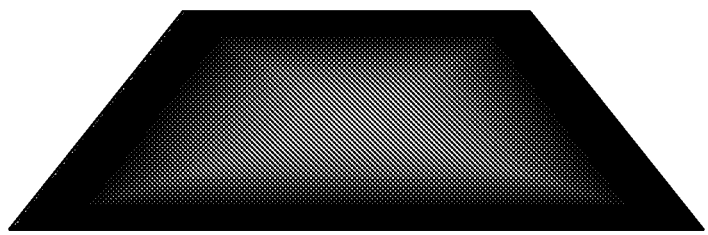
FIG. 10B shows an example of a display in the case where an organic EL panel that uses an organic EL panel translucent substrate having refractive index anisotropy is viewed diagonally.

The graph of FIG. 8 shows an example of the chromaticity change of an organic EL panel that uses an organic EL panel translucent substrate of the present invention. In FIG. 8, the vertical axis indicates the chromaticity change (Δu'v') and the horizontal axis indicates the angle (viewing angle) to the translucent substrate at the time of chromaticity measurement. The "angle (viewing angle) to the translucent substrate at the time of chromaticity measurement" is the angle from the front normal direction with the front normal direction of the organic EL panel translucent substrate (i.e., the direction perpendicular to the in-plane direction of the organic EL panel translucent substrate) being considered as 0°. In FIG. 8, "0°", "45°", "90°", and "135°" respectively indicate curves showing the chromaticity change in the case where the chromaticity change is observed at the angles of "0°", "45°", "90°", and "135°" from the front surface of the organic EL panel translucent substrate with the front surface being considered as 0°. The graph of FIG. 9 shows an example of the chromaticity change of an organic EL panel that uses an organic EL panel translucent substrate (for example, FIGS. 11 and 12) having refractive index anisotropy (refractive index anisotropy is not controlled). In FIG. 9, the vertical axis, horizontal axis, and curves "0°" "45°" "90°", and "135°" respectively indicate the same as those of FIG. 8. As shown in FIG. 9, with respect to the organic EL panel that uses a translucent substrate having refractive index anisotropy, there is a light leak when it is observed from the directions of 45° and 135° and the chromaticity changes due to the wavelength dependence. In contrast, since use of the translucent substrate of the present invention allows refractive index anisotropy in the substrate not to exist, a color gap/color shift can be suppressed from any angle of the organic EL panel. FIG. 10A schematically shows an example of a display in the case where an organic EL panel that uses the organic EL panel translucent substrate of the present invention is viewed diagonally. FIG. 10B schematically shows an example of a display in the case where an organic EL panel that uses an organic EL panel translucent substrate having refractive index anisotropy (the refractive index anisotropy is not controlled) is viewed diagonally. As shown in FIGS. 10A and 10B, organic EL panel 1001 of the present invention shown in FIG. 10A shows no display unevenness based on the color gap, the color shift, and the like depending on display areas whereas organic EL panel translucent substrate 1002 having refractive index anisotropy (the refractive index anisotropy is not controlled) shown in FIG. 10B shows display unevenness based on the color gap, the color shift, and the like depending on display areas.

Note that the thickness of the organic EL panel translucent substrate of the present invention is not particularly limited. For example, the organic EL panel translucent substrate of the present invention may be a flexible translucent substrate (flexible film) that can be bent (flexible) or a translucent substrate that has a large thickness to a degree that cannot be bent (inflexible). In the case where the organic EL panel translucent substrate of the present invention is flexible, the thickness thereof is, for example in the range from 20 µm to 300 µm, preferably in the range from 30 µm to 150 µm, and more preferably in the range from 50 µm to 100 µm. In the case where the organic EL panel translucent substrate of the present invention is inflexible, the thickness thereof is, for example, in the range from 300 µm to 10000 µm, preferably in the range from 500 µm to 5000 µm, and more preferably in the range from 700 µm to 3000 µm. A flexible (thin) translucent substrate has an advantage that the thickness of an organic EL panel can be reduced. On the other hand, an inflexible translucent substrate has an advantage in superior handleability because it is superior in strength and it is hardly broken and light as compared to a translucent substrate made of glass. Furthermore, even an inflexible translucent substrate can be easily thinned as compared to a glass translucent substrate because it is superior in strength and hardly broken. Inflexible translucent substrates are, for example, optimal to lighting for conveyances, transportation equipment, and the like (e.g., cars, airplanes, and the like) because it is hardly broken, safe, and light. Also inflexible translucent substrates are, for example, optimal to lighting for houses and the like because it can be thinned in addition to its unbreakability, safety, and lightness. However, these uses are illustrative and do not limit the present invention by any means.

In the case of an inflexible translucent substrate having a large thickness, because of its thickness, the retardation and partially-polarized light (distribution in a vibration direction) derived from a resin which is a material for forming the substrate are increased. Therefore, it is particularly important to use the substrate of the present invention that is substantially optically isotropic (the refractive index anisotropy does not substantially exist) in its in-plane direction and thickness direction. The method for controlling the substrate to be substantially optically isotropic in its in-plane direction and thickness direction is not particularly limited and, for example, may be the methods that will be described in the embodiments below.

The organic EL panel translucent substrate of the present invention may be used as it is in a planar shape such as a sheet, a film, a plate, or the like or may be used after processing it into any shape including a three-dimensional shape or the like. Particularly, when the organic EL panel translucent substrate is used after bending, the retardation, partially-polarized light, and the like caused by the distortion at a bent part are likely to occur. Therefore, it is particularly important to use the substrate of the present invention that is substantially optically isotropic (the refractive index anisotropy does not substantially exist) in its in-plane direction and thickness direction. The method for controlling the substrate to be substantially optically isotropic in its in-plane direction and thickness direction may be, as described above, the methods that will be described in the embodiments below.

Embodiment 2

Next, another embodiment of the present invention will be described.

Figure 3:
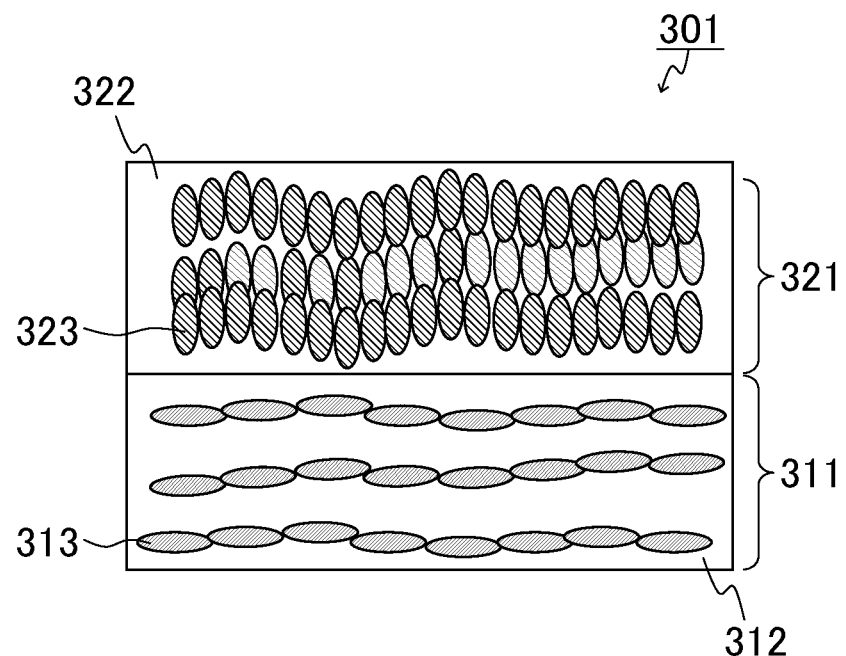
FIG. 3 is a cross sectional view schematically showing the structure of an organic EL panel translucent substrate of Embodiment 2.

The cross sectional view of FIG. 3 schematically shows an example of the structure of an organic EL panel translucent substrate of the present embodiment. As shown in FIG. 3, organic EL panel translucent substrate 301 is a laminate having a two-layer structure formed by lamination of resin films 311 and 321. Resin film 311 includes positive birefringent polymer film 312. Positive birefringent polymer film 312 is formed of positive birefringent polymer 313. Resin film 321 includes negative birefringent polymer film 322. Negative birefringent polymer film 322 is formed of negative birefringent polymer 323. Except for these, the organic EL panel translucent substrate of the present embodiment may be the same as the organic EL panel translucent substrate of Embodiment 1. Also an organic EL panel and an organic EL device that use the organic EL panel translucent substrates of the present embodiment may be the same as those of Embodiment 1 except that the organic EL panel translucent substrate of the present embodiment is used instead of the organic EL panel translucent substrate of Embodiment 1, for example. Note that although 311 and 321 are described as "resin films" for the sake of convenience, 311 and 321 are not limited to films (thin films) and may be, for example, a plate that has a large thickness to a degree that cannot be bent (inflexible). The same applies to the embodiments below.

Organic EL panel translucent substrate 301 of the present embodiment is, as described above, formed by lamination of positive birefringent polymer film 312 and negative birefringent polymer film 322. This allows the polarizability anisotropy and refractive index anisotropy of positive birefringent polymer 313 and negative birefringent polymer 323 to be cancelled in the whole translucent substrate 301. In other words, the whole translucent substrate is optically compensated and the birefringence is eliminated as a whole. This allows the viewing angle dependence of color and the wavelength dependence of color caused by the translucent substrate to be cancelled or reduced, for example.

The cancellation (elimination and optical compensation) of the birefringence (the polarizability anisotropy and refractive index anisotropy) is performed as shown in FIGS. 2(b) and 2(c), for example. That is, as shown in FIG. 2(b), refractive index ellipsoid 213 of frontward transmitted light 205a is nearly a circle as a result of synthesis of refractive index ellipsoid 211 of light transmitted through positive birefringent polymer film 312 and refractive index ellipsoid 212 of light transmitted through negative birefringent polymer film 322. Also as shown in FIG. 2(c), refractive index ellipsoid 223 of diagonally transmitted light 206a or 207a is nearly a circle as a result of synthesis of refractive index ellipsoid 221 of light transmitted through positive birefringent polymer film 312 and refractive index ellipsoid 222 of light transmitted through negative birefringent polymer film 322. However, FIGS. 2(b) and 2(c) are illustrative and do not limit the organic EL panel translucent substrate of the present embodiment and the present invention by any means.

Generally, when an organic EL panel translucent substrate is formed of a resin, certain polarizability anisotropy (this polarizability defines a refractive index) exists in a monomer unit that forms a polymer chain of the resin. The polarizability anisotropy also exists in a polymer chain made by the polymerization of monomers. In a polymerized polymer chain, the refractive index is large in the direction in which the polarizability is large. Thus the substrate shows the refractive index anisotropy caused by the difference in refractive index between polarized light that is parallel with the polymer chain and polarized light that is perpendicular to the polymer chain. Such refractive index anisotropy mainly caused by the molecular structure.

As a flexible resin substrate and a binder (e.g., a thermoplastic resin) and the monomer thereof used for a transparent polymer film, either a material having negative molecular polarizability anisotropy or a material having positive molecular polarizability anisotropy has been used, and the birefringence has not been considered. For example, polymethyl methacrylate, polyethyl methacrylate, polybutyl methacrylate, polymethyl acrylate, polyethyl acrylate, polybutyl acrylate, polystyrene, epoxy, phenoxy, a copolymer of methacrylic acid and styrene, or the like used as a resin that forms a polymer film is the material having negative birefringence. For a monomer, as a representative example of a material having negative birefringence, polyvalent acryl such as allyl acrylate, cyclohexyl acrylate, or the like has been used.

The inventors of the present invention have found that the refractive index anisotropy in the in-plane direction and thickness direction of the substrate can be controlled by using both of a polymer showing negative birefringence (negative birefringent polymer) and a polymer showing positive birefringence (positive birefringent polymer). For example, the birefringence (refractive index anisotropy) and the like of the negative birefringent polymer and the birefringence (refractive index anisotropy) and the like of the positive birefringent polymer can be cancelled to each other (the whole organic EL panel translucent substrate is allowed to be substantially optically isotropic in which the refractive index anisotropy in the in-plane direction and thickness direction does not substantially exist).

The forming material and manufacturing method for the organic EL panel translucent substrate of the present embodiment are not particularly limited and can be as follows, for example.

The forming material of the organic EL panel translucent substrate may contain a volatile component (organic solvent) and a non-volatile component, for example. The translucent substrate can be manufactured by a casting method, a solution casting film formation method, or the like by solving the non-volatile component in an organic solvent. The non-volatile component contains a thermoplastic resin (binder) or the monomer thereof as a main component and may also contain a plasticizer, a polymerization catalyst, a stabilizer, and the like as needed, for example. The non-volatile component that forms the translucent substrate contains at least a part showing negative birefringence and a part showing positive birefringence, and can be selected from the following components as needed. As the volatile component, one or two or more of the following organic solvents can be selected.

(1) Thermoplastic Resin Solution (Binder)

The binder contains a negative birefringent polymer and a positive birefringent polymer. The negative birefringent polymer is not particularly limited and examples of the monomer thereof include ethylene unsaturated carboxylic esters such as methyl methacrylate, ethyl methacrylate, propyl methacrylate, butyl methacrylate, cyclohexyl methacrylate, butylcyclohexyl methacrylate, methyl acrylate, ethyl acrylate, propyl acrylate, butyl acrylate, cyclohexyl acrylate, butylcyclohexyl acrylate, and the like and aromatic vinyl compounds such as styrene and the like. The positive birefringent polymer is not particularly limited and examples of the monomer thereof include ethylene unsaturated carboxylic esters such as difluoroethyl methacrylate, trifluoroethyl methacrylate, tetrafluoroethyl methacrylate, perfluoroethyl methacrylate, trihydroperfluoropropyl methacrylate, dichloroethyl methacrylate, trichloroethyl methacrylate, tetrachloroethyl methacrylate, benzyl methacrylate, and the like and vinyl chloride.

(2) Organic Solvent

The organic solvent is not particularly limited and examples thereof include cyclohexanone, butylcellosolve, propylene glycol monomethyl ether acetate (PEGMEA), propylene glycol monomethyl ether (PEGME), ethyl-3-ethoxypropionate (EEP), diethylene glycol dimethyl ether (MEC), methoxypropyl acetate, ethyl acetate, n-butyl acetate, and 3-methoxybutyl acetate, and one of them may be used alone or two or more of them may be used in combination.

The monomer may be polymerized to be a negative birefringent polymer or a positive birefringent polymer and then dissolved in the organic solvent to form a polymer film showing negative birefringence or a polymer film showing positive birefringence. Also the monomer as it is may be dissolved in the organic solvent to form a film and then the monomer may be polymerized to be a negative birefringent polymer or a positive birefringent polymer. As a polymer film showing negative birefringence, for example, a transparent polymer film containing polymethyl methacrylate as a main component may be used. As a polymer film showing positive birefringence, for example, a transparent polymer film containing polyethylene terephthalate as a main component may be used. The polymer film showing negative birefringence and the polymer film showing positive birefringence are stuck to form the organic EL panel translucent substrate of the present embodiment. The polymer film showing negative birefringence and the polymer film showing positive birefringence can be manufactured, for example, as follows.

(Formation of Film from Solution)

The binder solution or the monomer solution is formed into a flexible film by a casting method/solution casting method (solution casting film formation method) which is one of the methods for manufacturing an optical film. The solution casting method is to prepare a resin solution (dope) by dissolving a resin in a solvent and adding various additives such as a plasticizer, an ultraviolet absorber, an antioxidant, and the like thereto as needed. The resin solution prepared in this manner is discharged from a die to cast on a movable support such as an endless belt, a drum, or the like that is traveling or rotating. The casting film (web) formed in this manner is dried to some extent on the support and is peeled from the support, the resin film peeled is caused to pass through a dryer or the like while transferring by various transfer means, and thereby forms an optical film. The respective steps will be described hereinbelow.

(1) Dissolving Step

The resin can be dissolved by various dissolving methods such as a method performed by applying pressure above the boiling point of a main solvent, a method performed below the boiling point of a main solvent, a method performed under normal pressure, a method performed under high pressure, and the like. Particularly, the method performed by applying pressure above the boiling point of a main solvent is preferable. Additives are added to the dope in which the resin is dissolved to be dissolved and dispersed, the resultant is filtrated and degassed, and then the resultant is sent to the next step.

(2) Casting Step

The dope is delivered to a pressure die through a delivery pump and is cast on the casting position of a metal support such as an endless metal belt (e.g., stainless belt), a rotatable metal drum, or the like. The dope may be cast from a pressure die slit, for example. For accelerating the film formation speed, plural pressure dies may be provided above a metal support, the dope may be divided to the respective dies, and casting may be performed in an overlapped manner. Also a film having a layered structure can be obtained by a co-casting method of casting plural dopes at the same time.

(3) Solvent Evaporation Step

In this step, a web (a dope film formed by casting a dope on a casting support) is heated on a casting support and a solvent is evaporated to form a film. As the method for evaporating the solvent, a method of blowing a wind from the web side, a method of transferring heat by a liquid from the back side of the support, a method of transferring heat by radiant heat from both sides of the support, or the like may be employed. Among them, it is preferable to employ the back side liquid heat transfer method (the method of transferring heat by a liquid from the back side of the support) because of its superior drying efficiency. Also the respective methods may be combined.

(4) Peeling Step

The web after evaporating the solvent on the metal support is peeled at the peeling position. The web peeled in this manner is sent to the next step.

(5) Drying Step

The web after peeling is dried. The method and apparatus for drying the web are not particularly limited. For example, the web can be dried using a dryer in which the web is transferred by alternately passing through plural rolls provided in the dryer or a tenter stretching apparatus in which the web is transferred in the state where both ends of the web are gripped. As the drying method, hot air may be blown on both sides of the web or infrared rays may be irradiated to the web to heat and dry the web, for example. The drying time and drying temperature are not particularly limited. For example, an optimal drying time can be selected for improving film quality such as ease of thermal contraction, stress accumulation, and the like; improving planarity; reducing surface roughness, and the like.

(6) Heat Treatment Step

The film in the state where the residual solvent is adjusted in the range from 1 to 50 wt % in the drying step is heat-treated at a glass-transition temperature in the range from +20 to 100° C. The heating time is preferably about 60 minutes or shorter in consideration of production efficiency. In the heat treatment step, the residual solvent is removed at the same time. The amount of the residual solvent of the film after this step is preferably less than 1.0 wt %.

Note that the birefringence of the translucent substrate can be controlled by changing the thickness ratio between the polymer film showing negative birefringence and the polymer film showing positive birefringence. By utilizing this, the birefringence of the negative birefringent monomer and the birefringence of the positive birefringent monomer can be cancelled to each other. Furthermore, by changing the thickness ratio between the polymer film showing negative birefringence and the polymer film showing positive birefringence, the birefringence of a resin can be controlled to be optimal to each wavelength of RGB. This makes it possible to reduce the wavelength dispersibility in the in-plane retardation, to emit light along the whole wavelength of visible light also in an oblique view, and to prevent a color gap and coloring easily. Since these make it possible to cancel the refractive index anisotropy of the organic EL panel translucent substrate, the color gap and coloring can be suppressed from any angle.

Figure 2:
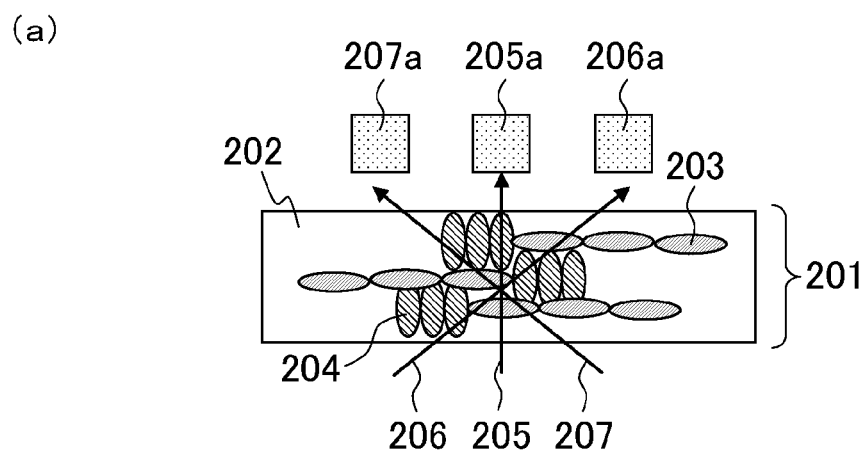
FIG. 2 is a diagram schematically showing the state of a first organic EL panel translucent substrate of the present invention when light is transmitted.
Figure 2:
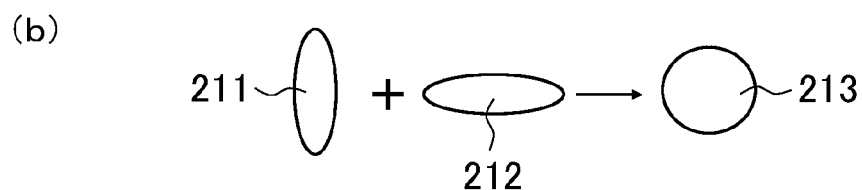
Figure 2:
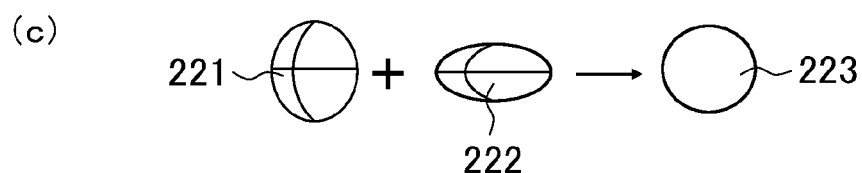

FIG. 2 shows an example in which a translucent substrate is formed by lamination of two polymer films. However, the present invention is not limited thereto and can be an organic EL panel translucent substrate in which three or more films are laminated as long as the translucency is not hindered, for example. For example, it is preferable to select an optimal arrangement including lamination order using several kinds of films having different retardation. This makes it possible to provide an organic EL panel translucent substrate that can correct the refractive index anisotropy or the partially-polarized light to be optimal to the organic EL panel to be used.

Embodiment 3

Next, still another embodiment of the present invention will be described.

Figure 4:
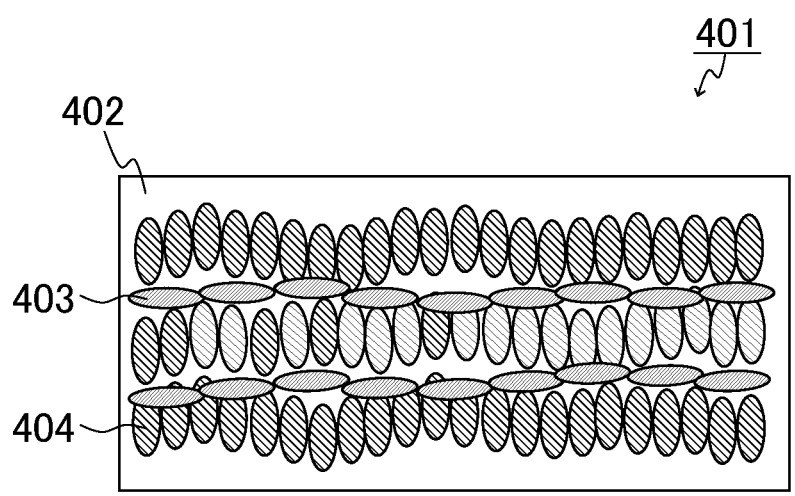
FIG. 4 is a cross sectional view schematically showing the structure of an organic EL panel translucent substrate of Embodiment 3.

The cross sectional view of FIG. 4 schematically shows an example of the structure of an organic EL panel translucent substrate of the present embodiment. As shown in FIG. 4, organic EL panel translucent substrate 401 includes resin film 402. Resin film 402 (organic EL panel translucent substrate 401) is formed by mixture (blend) of polymer 404 showing negative birefringence and polymer 403 showing positive birefringence. The refractive index anisotropy is thereby cancelled in organic EL panel translucent substrate 401 and, macroscopically, the birefringence does not occur in the whole organic EL panel translucent substrate 401, for example. This makes it possible to suppress the color gap and color shift (coloring) from any angle, for example.

The birefringence of translucent substrate 401 can be controlled by changing the blend ratio between polymer 404 showing negative birefringence and polymer 403 showing positive birefringence. For example, translucent substrate 401 may be substantially optically isotropic (the refractive index anisotropy does not substantially exist) in its in-plane direction and thickness direction. Also the birefringence of translucent substrate 401 may be controlled so that it has refractive index anisotropy in at least one of the in-plane direction and thickness direction. This makes it possible, even in the case where members having a variety of birefringence are used for an organic EL panel or an organic EL panel has a property of having birefringence, to cancel the birefringence (i.e. this makes it possible to control the whole organic EL panel to be optically isotropic in which the refractive index anisotropy in the in-plane direction and thickness direction does not substantially exist), for example. Furthermore, by appropriately changing the blend ratio between polymer 404 showing negative birefringence and polymer 403 showing positive birefringence, the birefringence of a resin can be controlled to be optimal to each wavelength of RGB. This makes it possible to reduce the wavelength dispersibility in the in-plane retardation, to emit light along the whole wavelength of visible light also in an oblique view, and to prevent coloring easily.

The organic EL panel translucent substrate of the present embodiment can be manufactured in the same manner as in Embodiment 2 except that it is manufactured by mixture of a negative birefringent polymer and a positive birefringent polymer (binder). As monomers of the binder (thermoplastic resin), for example, ethylene unsaturated carboxylic esters, aromatic vinyl compounds, and the like can be used. When monomers are polymerized to be a polymer, the polymer often shows refractive index anisotropy. Therefore, for example, it is preferable to distribute the binder component and the monomer component in such a manner that the birefringence can be cancelled to each other for preventing the respective color layers after formation of the translucent substrate from showing the birefringence. Examples of the monomer include methyl methacrylate, ethyl methacrylate, butyl methacrylate, methyl acrylate, ethyl acrylate, butyl acrylate, trifluoroethyl methacrylate, perfluoroethyl methacrylate, dichloroethyl methacrylate, trichloroethyl methacrylate, and benzyl methacrylate. The monomer may be the same as those described in Embodiment 2. One of the monomers may be used alone or two or more of them may be used in combination. Examples of the negative birefringent polymer include polymethyl methacrylate (PMMA), polyethyl methacrylate, polybutyl methacrylate, polymethyl acrylate, polyethyl acrylate, and butyl acrylate. The negative birefringent polymer may be the same as those described in Embodiment 2. Examples of the positive birefringent polymer include L-polylactic acid, polyvinylidene fluoride, a copolymer of polyvinylidene fluoride and trifluoroethylene, polyethylene oxide, polyethylene terephthalate, polyethylene naphthalate, polyphenylene ether, and polyphenylene oxide. The positive birefringent polymer may be the same as those described in Embodiment 2. One of the positive birefringent polymers may be used alone or two or more of them may be used in combination.

An example of the components and the ratio among the components to be used in the case of manufacturing the organic EL panel translucent substrate (obtained by mixture of a negative birefringent polymer and a positive birefringent polymer) of the present embodiment is described as follows. In the case where the following binders are mixed (blended), the birefringence of the translucent substrate can be cancelled with the weight ratio between polymethyl methacrylate and L-polylactic acid from 80:20 to 90:10, for example.

Binder: binder resin blend of partially not esterified-polymethyl methacrylate and L-polylactic acid 20 to 60 wt %
Monomer: methyl methacrylate 5 to 20 wt %
Solvent: propylene glycol monomethyl ether acetate 30 to 75 wt %

The organic EL panel and organic EL device of the present embodiment are not particularly limited and, for example, may be the same as those of Embodiment 1 or 2 except that the organic EL panel translucent substrate of the present embodiment is used.

Embodiment 4

Next, yet another embodiment of the present invention will be described.

Figure 5:
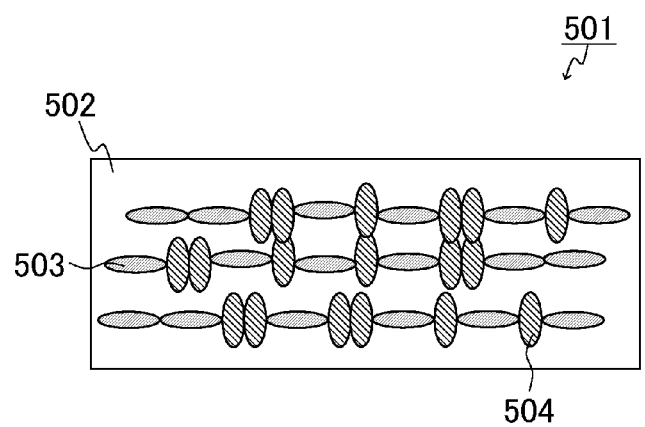
FIG. 5 is a cross sectional view schematically showing the structure of an organic EL panel translucent substrate of Embodiment 4.

The cross sectional view of FIG. 5 schematically shows an example of the structure of an organic EL panel translucent substrate of the present embodiment. As shown in FIG. 5, organic EL panel translucent substrate 501 includes resin film 502. Resin film 502 (organic EL panel translucent substrate 501) is formed by random copolymerization of polymer 504 showing negative birefringence and polymer 503 showing positive birefringence. Such copolymerization allows the polarizability anisotropy to be cancelled by a polymer chain unit, for example. The refractive index anisotropy is thereby cancelled in organic EL panel translucent substrate 501 and, macroscopically, the birefringence does not occur in the whole organic EL panel translucent substrate 501, for example. This makes it possible to suppress the color gap and color shift (coloring) from any angle, for example. Also the birefringence of the whole organic EL panel may be canceled by the refractive index anisotropy of organic EL panel translucent substrate 501 (i.e. the whole organic EL panel may be controlled to be substantially optically isotropic in which the refractive index anisotropy in the in-plane direction and thickness direction does not substantially exist). For example, in the same manner as in the aforementioned embodiments, the birefringence of the organic EL panel translucent substrate can be controlled by controlling the ratio (mass ratio, or the like) between the negative birefringent polymer and the positive birefringent polymer to be used.

The manufacturing method for the organic EL panel translucent substrate of the present embodiment is not particularly limited. The organic EL panel translucent substrate of the present embodiment can be manufactured in the same manner as in the aforementioned embodiments except that the random copolymerization of the negative birefringent polymer and the positive birefringent polymer is performed, for example. For example, the random copolymerization of monomers may be performed to form a random copolymer of the negative birefringent polymer and the positive birefringent polymer and then the random copolymer as a binder may be formed into the shape of a translucent substrate. Also the monomer solution may be formed into the shape of a translucent substrate and then the random copolymerization of the resultant may be performed. Also both of the binder and the monomer may be used in combination. Examples of the monomer of the random copolymer include polymethyl methacrylate (PMMA), polyethyl methacrylate, polypropyl methacrylate, polymethyl acrylate, polyethyl acrylate, and polypropyl acrylate. The monomer may be the same as those described in the aforementioned embodiments. One of the monomers may be used alone or two or more of them may be used in combination. Examples of the negative birefringent monomer include methyl methacrylate, ethyl methacrylate, butyl methacrylate, isobutyl methacrylate, 2-ethylhexyl methacrylate, octyl methacrylate, dodecyl methacrylate, hexyl methacrylate, methyl acrylate, ethyl acrylate, butyl acrylate, isobutyl acrylate, 2-ethylhexyl acrylate, octyl acrylate, dodecyl acrylate, and hexyl acrylate. The monomer may be the same as those described in the aforementioned embodiments. One of the monomers may be used alone or two or more of them may be used in combination. Examples of the positive birefringent monomer include difluoroethyl methacrylate, trifluoroethyl methacrylate, tetrafluoroethyl methacrylate, perfluoroethyl methacrylate, trihydroperfluoropropyl methacrylate, dichloroethyl methacrylate, trichloroethyl methacrylate, tetrachloroethyl methacrylate, and benzyl methacrylate. The monomer may be the same as those described in the aforementioned embodiments. One of the monomers may be used alone or two or more of them may be used in combination.

An example of the components and the ratio among the components to be used in the case of manufacturing the organic EL panel translucent substrate (obtained by random copolymerization of a negative birefringent polymer and a positive birefringent polymer) of the present embodiment is described as follows. The birefringence of the translucent substrate can be cancelled with the weight ratio between methyl methacrylate and perfluoroethyl methacrylate from 80:20 to 85:15, for example.

Binder: binder resin PMMA 20 to 60 wt %
Monomer: methyl methacrylate, perfluoroethyl methacrylate 5 to 20 wt %
Solvent: propylene glycol monomethyl ether acetate 30 to 70 wt %

The organic EL panel and organic EL device of the present embodiment are not particularly limited and, for example, may be the same as those of the aforementioned embodiments except that the organic EL panel translucent substrate of the present embodiment is used.

Embodiment 5

Next, further another embodiment of the present invention will be described.

Figure 6:
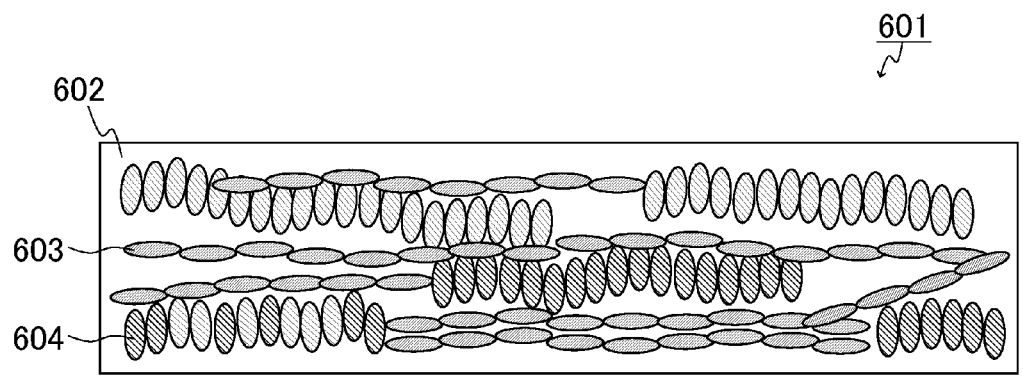
FIG. 6 is a cross sectional view schematically showing the structure of an organic EL panel translucent substrate of Embodiment 5.

The cross sectional view of FIG. 6 schematically shows an example of the structure of an organic EL panel translucent substrate of the present embodiment. As shown in FIG. 6, organic EL panel translucent substrate 601 includes resin film 602. Resin film 602 (organic EL panel translucent substrate 601) is formed by block copolymerization of polymer 604 showing negative birefringence and polymer 603 showing positive birefringence. Such copolymerization allows the polarizability anisotropy to be cancelled by a polymer chain unit, for example. The refractive index anisotropy is thereby cancelled in organic EL panel translucent substrate 601 and, macroscopically, the birefringence does not occur in the whole organic EL panel translucent substrate 601, for example. This makes it possible to suppress the color gap and color shift (coloring) from any angle, for example. Also the birefringence of the whole organic EL panel may be canceled (i.e. the whole organic EL panel may be controlled to be substantially optically isotropic in which the refractive index anisotropy in the in-plane direction and thickness direction does not substantially exist) by the refractive index anisotropy of organic EL panel translucent substrate 601. For example, in the same manner as in the aforementioned embodiments, the birefringence of the organic EL panel translucent substrate can be controlled by controlling the ratio (mass ratio, or the like) between the negative birefringent polymer and the positive birefringent polymer to be used.

The manufacturing method for the organic EL panel translucent substrate of the present embodiment is not particularly limited. The organic EL panel translucent substrate of the present embodiment can be manufactured in the same manner as in the aforementioned embodiments except that the block copolymerization of the negative birefringent polymer and the positive birefringent polymer is performed, for example. For example, the block copolymerization of monomers may be performed to form a block copolymer of the negative birefringent polymer and the positive birefringent polymer and then the block copolymer as a binder may be formed into the shape of a translucent substrate. Also the monomer solution may be formed into the shape of a translucent substrate and then the block copolymerization of the resultant may be performed. Also both of the binder and the monomer may be used in combination. For example, alkali-soluble block copolymer including a block showing negative birefringence at one side and a block showing positive birefringence at one side may be used. Furthermore, either block may partially include at least an acid group such as a carboxyl group, a hydroxyl group, or the like. When monomers are polymerized to be a polymer, the polymer often shows refractive index anisotropy. Therefore, for example, it is preferable to distribute the binder component and the monomer component in such a manner that the birefringence can be cancelled to each other for preventing the respective color layers after formation of the translucent substrate from showing the birefringence. Examples of the monomer include methyl methacrylate, ethyl methacrylate, butyl methacrylate, methyl acrylate, ethyl acrylate, butyl acrylate, trifluoroethyl methacrylate, perfluoroethyl methacrylate, dichloroethyl methacrylate, trichloroethyl methacrylate, and benzyl methacrylate. The monomer may be the same as those described in the aforementioned embodiments. One of the monomers may be used alone or two or more of them may be used in combination. Examples of the monomer of the block having negative birefringence include ethylene unsaturated carboxylic esters such as methyl methacrylate, ethyl methacrylate, propyl methacrylate, butyl methacrylate, cyclohexyl methacrylate, butylcyclohexyl methacrylate, methyl acrylate, ethyl acrylate, propyl acrylate, butyl acrylate, cyclohexyl acrylate, butylcyclohexyl acrylate, and the like and aromatic vinyl compounds such as styrene and the like. One of the monomers may be used alone or two or more of them may be used in combination. Examples of the monomer of the block having positive birefringence include ethylene unsaturated carboxylic esters such as difluoroethyl methacrylate, trifluoroethyl methacrylate, tetrafluoroethyl methacrylate, perfluoroethyl methacrylate, trihydroperfluoropropyl methacrylate, dichloroethyl methacrylate, trichloroethyl methacrylate, tetrachloroethyl methacrylate, benzyl methacrylate, and the like and vinyl chloride. One of the monomers may be used alone or two or more of them may be used in combination.

The introduction of an acid group into the block having positive birefringence or negative birefringence can be performed by copolymerization with a monomer that is capable of copolymerizing with a monomer including an acid group such as ethylene unsaturated carboxylic acid or the like and that does not include the acid group and has positive birefringence or negative birefringence, for example. Examples of ethylene unsaturated carboxylic acid include acrylic acid, methacrylic acid, maleic acid, fumaric acid, itaconic acid, and crotonic acid.

The polymerization method for obtaining a block copolymer is not particularly limited and a well known method can be used. Examples of the polymerization method include a method of utilizing a macromonomer, a living polymerization method that allows precise polymerization, and a method of bonding different blocks by the reaction of functional groups. Use of a macromonomer such as polymethyl methacrylate or the like allows a desired block copolymer to be obtained by a simple radical polymerization method.

An example of the components and the ratio among the components to be used in the case of manufacturing the organic EL panel translucent substrate (obtained by block copolymerization of a negative birefringent polymer and a positive birefringent polymer) of the present embodiment is described as follows. The birefringence of the translucent substrate can be cancelled with the weight ratio between methyl methacrylate and perfluoroethyl methacrylate from 80:20 to 85:15, for example. When a block copolymer is used as a binder, the copolymerization amount of a monomer including an acid group with respect to the whole monomer used for manufacturing the binder is preferably in the range from 5 to 50%.

Binder: block copolymer obtained by introducing a methacrylic acid partially into polymethyl methacrylate having negative birefringence and perfluoroethyl methacrylate having positive birefringence 20 to 60 wt %
Monomer: methyl methacrylate 5 to 10 wt %
Solvent: propylene glycol monomethyl ether acetate 30 to 70 wt %

The organic EL panel and organic EL device of the present embodiment are not particularly limited and, for example, may be the same as those of the aforementioned embodiments except that the organic EL panel translucent substrate of the present embodiment is used.

Embodiment 6

Next, still further another embodiment of the present invention will be described.

Figure 7:
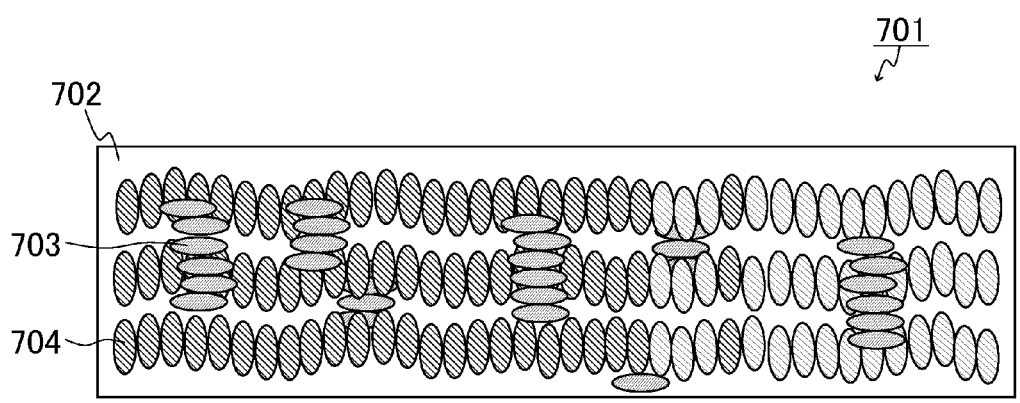
FIG. 7 is a cross sectional view schematically showing the structure of an organic EL panel translucent substrate of Embodiment 6.

The cross sectional view of FIG. 7 schematically shows an example of the structure of an organic EL panel translucent substrate of the present embodiment. As shown in FIG. 7, organic EL panel translucent substrate 701 includes resin film 702. Resin film 702 (organic EL panel translucent substrate 701) is formed by graft copolymerization of polymer 704 showing negative birefringence and polymer 703 showing positive birefringence. Such copolymerization allows the polarizability anisotropy to be cancelled by a polymer chain unit, for example. The refractive index anisotropy is thereby cancelled in organic EL panel translucent substrate 701 and, macroscopically, the birefringence does not occur in the whole organic EL panel translucent substrate 701, for example. This makes it possible to suppress the color gap/color shift (coloring) from any angle, for example. Also the birefringence of the whole organic EL panel may be canceled (i.e. the whole organic EL panel may be controlled to be optically isotropic in which the refractive index anisotropy in the in-plane direction and thickness direction does not substantially exist) by the refractive index anisotropy of organic EL panel translucent substrate 701.

For example, in the same manner as in the aforementioned embodiments, the birefringence of the organic EL panel translucent substrate can be controlled by controlling the ratio (mass ratio, or the like) between the negative birefringent polymer and positive birefringent polymer to be used.

The manufacturing method for the organic EL panel translucent substrate of the present embodiment is not particularly limited. The organic EL panel translucent substrate of the present embodiment can be manufactured in the same manner as in the aforementioned embodiments except that the graft copolymerization of the negative birefringent polymer and the positive birefringent polymer is performed, for example. For example, the graft copolymerization of monomers may be performed to form a graft copolymer of the negative birefringent polymer and the positive birefringent polymer and then the graft copolymer as a binder may be formed into the shape of a translucent substrate. Also the monomer solution may be formed into the shape of a translucent substrate and then the graft copolymerization of the resultant may be performed. Also both of the binder and the monomer may be used in combination. In the case where the graft copolymer is used as a binder, for example, an alkali-soluble graft copolymer including a trunk part or a branch part showing negative birefringence at one side and a branch part or a trunk part showing positive birefringence at one side may be used. Furthermore, for example, a trunk part or a branch part may partially include at least an acid group such as a carboxyl group, a hydroxyl group, or the like. When monomers are polymerized to be a polymer, the polymer often shows refractive index anisotropy. Therefore, for example, it is preferable to distribute the binder component and monomer component in such a manner that the birefringence can be cancelled to each other for preventing the respective color layers after formation of the translucent substrate from showing the birefringence. Examples of the monomer include methyl methacrylate, ethyl methacrylate, butyl methacrylate, methyl acrylate, ethyl acrylate, butyl acrylate, trifluoroethyl methacrylate, perfluoroethyl methacrylate, dichloroethyl methacrylate, trichloroethyl methacrylate, and benzyl methacrylate. The monomer may be the same as those described in the aforementioned embodiments. One of the monomers may be used alone or two or more of them may be used in combination. Examples of the monomer of the trunk part or the branch part having negative birefringence include ethylene unsaturated carboxylic esters such as methyl methacrylate, ethyl methacrylate, propyl methacrylate, butyl methacrylate, cyclohexyl methacrylate, butylcyclohexyl methacrylate, methyl acrylate, ethyl acrylate, propyl acrylate, butyl acrylate, cyclohexyl acrylate, butylcyclohexyl acrylate, and the like and aromatic vinyl compounds such as styrene and the like. One of the monomers may be used alone or two or more of them may be used in combination. Examples of the monomer of the branch part or the trunk part having positive birefringence include ethylene unsaturated carboxylic esters such as difluoroethyl methacrylate, trifluoroethyl methacrylate, tetrafluoroethyl methacrylate, perfluoroethyl methacrylate, trihydroperfluoropropyl methacrylate, dichloroethyl methacrylate, trichloroethyl methacrylate, tetrachloroethyl methacrylate, benzyl methacrylate, and the like and vinyl chloride. One of the monomers may be used alone or two or more of them may be used in combination.

The introduction of an acid group into the block having positive birefringence or negative birefringence can be performed by copolymerization with a monomer that is capable of copolymerizing with a monomer including an acid group such as ethylene unsaturated carboxylic acid or the like and that does not include the acid group and has positive birefringence or negative birefringence, for example. Examples of ethylene unsaturated carboxylic acid include acrylic acid, methacrylic acid, maleic acid, fumaric acid, itaconic acid, and crotonic acid.

The polymerization method for obtaining a graft copolymer is not particularly limited and a well known method can be used. Examples of the polymerization method include a method of utilizing a macromonomer, a living polymerization method that allows precise polymerization, and a method of bonding different blocks by the reaction of functional groups. Use of a macromonomer allows a desired graft copolymer to be obtained by a simple radical polymerization method.

The graft polymer is likely to take a bulky amorphous structure (high-order structure) and not likely to express orientation birefringence. Therefore, the graft polymerization may be performed using polymers both showing negative birefringence or polymers both showing positive birefringence. This may allow the translucent substrate to be substantially optically isotropic (the refractive index anisotropy does not substantially exist) in its in-plane direction and thickness direction, for example.

An example of the components and the ratio among the components to be used in the case of manufacturing the organic EL panel translucent substrate (obtained by graft copolymerization of a negative birefringent polymer and a positive birefringent polymer) of the present embodiment is described as follows. The birefringence of the translucent substrate can be cancelled with the weight ratio between ethyl acrylate+methyl methacrylate and perfluoroethyl methacrylate from 80:20 to 85:15, for example. When a graft copolymer is used as a binder, the copolymerization amount of a monomer including an acid group with respect to the whole monomer used for manufacturing the binder is preferably in the range from 5 to 50%.

Binder: graft copolymer in which polyethyl acrylate is used for a trunk part and perfluoroethyl methacrylate is used for a branch part 20 to 60 wt %
Monomer: methyl methacrylate 5 to 20 wt %
Solvent: propylene glycol monomethyl ether acetate 30 to 70 wt %

The organic EL panel and organic EL device of the present embodiment are not particularly limited and, for example, may be the same as those of the aforementioned embodiments except that the organic EL panel translucent substrate of the present embodiment is used.

Example

Organic EL panel translucent substrates that are substantially optically isotropic in their in-plane direction and thickness direction (the refractive index anisotropy in the in-plane direction and thickness direction does not substantially exist in the substrates) were respectively manufactured by the methods according to Embodiments 2 to 6. Then, organic EL panels were manufactured using the thus obtained organic EL panel translucent substrates. In the organic EL panel, copper phthalocyanine (Cu-Pc) was used for the hole injection material. For the hole transport material, α-NPD(N,N'-diphenyl-N—N-bis(1-naphthyl)-1,1'-biphenyl)-4,4'-diamine) was used. For the light-emitting material, the one obtained by doping 4,4'-biscarbazolylbiphenyl (CBP) with tris-(2 phenylpyridine) iridium complex (Ir(ppy)$_3$) and bis(2-(2'-benzo(4,5-α)thienyl)pyridinate-N,C2') (acetylacetonate) iridium complex (Btp$_2$Ir(acac)) and the one obtained by doping CBP with (bis(4,6-di-fluorophenyl)-pyridinate-N,C2')picolinateiridium complex (FIr(pic)) were used. For the hole block layer material, 2,9-dimethyl-4,7-diphenyl-1,10-phenanthroline (BCP) was used. For the electron transport layer material, Alq$_3$ was used. For the electron injection material, LiF was used. For the cathode, Al was used. For the anode, ITO was used. The chromaticity changes of these organic EL panels were measured. As a result, as shown in FIG. 9, the color gaps/color shifts could be suppressed from any angle of the organic EL panel.

The present invention was described above with reference to the embodiments. However, the present invention is not limited to the above-described embodiments. Various changes that can be understood by those skilled in the art can be made in the configurations and details of the present invention within the scope of the present invention. For example, in the aforementioned embodiments, the case of using both of a negative birefringent polymer and a positive birefringent polymer is mainly described. However, the present invention is not limited thereto. An organic EL panel translucent substrate of the present invention may be manufactured using only one of a negative birefringent polymer or a positive birefringent polymer, for example. In this case, for example, plural birefringent polymer films may be overlapped while extending the films in different axial directions in the in-plane direction (x direction and y direction) for changing their orientations or the plural birefringent polymer films may be overlapped while adjusting the overlap angles by reversing the films. This makes it possible to control the refractive index anisotropy as in the case of using both of a negative birefringent polymer and a positive birefringent polymer, for example. In an organic EL panel, there may be the wavelength dependence of the optical orientation due to the film thickness interference and the like depending on the light-emitting position, the film thickness, and the reflections at the cathode. In contrast, as described above, by allowing the organic EL panel translucent substrate of the present invention to have refractive index anisotropy, it is possible to cancel the wavelength dependence of the optical orientation and to prevent or reduce the color gap/coloring.

The organic EL panel translucent substrate of the present invention can be used for an organic EL lighting panel or an organic EL display panel, for example. In other words, the organic EL panel of the present invention may be, for example, an organic EL lighting panel or an organic EL display panel. The organic EL device of the present invention may be, for example, an organic EL lighting device, an organic EL display, or the like. Examples of the uses of the organic EL panel and the organic EL device of the present invention include the backlight for a liquid crystal display and the like. The organic panel and the organic EL device of the present invention can be for indoor use, outdoor use, on-vehicle use, and the like, for example. However, the present invention is not limited thereto and has a wide range of uses. For example, the present invention can be applied to any use including the uses similar to those of common organic EL panels and organic EL devices.

The invention of the present application was described above with reference to the embodiments. However, the invention of the present application is not limited to the above-described embodiments. Various changes that can be understood by those skilled in the art can be made in the configurations and details of the invention of the present application within the scope of the invention of the present application.

Some of or all of the embodiments can also be described as the following supplementary notes. However, the present invention is not limited thereto.

(Supplementary Note 1)

An organic EL panel translucent substrate formed of a resin, wherein the substrate is substantially optically isotropic in its in-plane direction and thickness direction.

(Supplementary Note 2)

The organic EL panel translucent substrate according to supplementary note 1 satisfying at least one of the following conditions (A) to (E):

[Condition (A)]

With respect to light having a wavelength of 550 nm incident from a direction perpendicular to the in-plane direction of the organic EL panel translucent substrate, in-plane retardation Rip represented by the following equation (I) is 30 nm or less and thickness direction retardation Rth represented by the following equation (II) is 80 nm or less.

$$Rip=(nx-ny)\cdot d \quad (I)$$

$$Rth=\{(nx+ny)/2-nz\}\cdot d \quad (II)$$

In equations (I) and (II), nx, ny, and nz respectively represent refractive indices in an X-axis direction, a Y-axis direction, and a Z-axis direction in the organic EL panel translucent substrate. The X-axis direction is an axial direction in which the in-plane refractive index of the organic EL panel translucent substrate is the greatest, the Y-axis direction is an axial direction that is perpendicular to the X-axis direction in the plane, and the Z-axis direction is a thickness direction that is perpendicular to the X axis and the Y axis.

Furthermore, in equations (I) and (II), d represents a thickness (nm) of the organic EL panel translucent substrate.

[Condition (B)]

With respect to light having a wavelength of 550 nm incident from a direction at an angle of 45° to the in-plane direction of the organic EL panel translucent substrate, a numerical value (Rth/Rip) obtained by dividing the Rth represented by equation (II) by the Rip represented by equation (I) is 5.0 or less.

[Condition (C)]

With respect to light incident from a direction perpendicular to the in-plane direction of the organic EL panel translucent substrate, the in-plane retardation Rip represented by equation (I) in a wavelength range from 380 to 780 nm to the Rip at a wavelength of 550 nm is in a range from 95 to 110% (ratio is in a range from 0.95 to 1.10), and the thickness direction retardation Rth represented by equation (II) in a wavelength range from 380 to 780 nm to the Rth at a wavelength of 550 nm is in a range from 90 to 115% (ratio is in a range from 0.90 to 1.15).

[Condition (D)]

At the same measurement wavelength, a luminance at an angle in a range from 2 to 90° to the in-plane direction of the organic EL panel translucent substrate to a luminance at an angle of 90° to the in-plane direction of the organic EL panel translucent substrate is in a range from 85 to 110%, and a chromaticity change Δu' v' at an angle in a range from 2 to 90° to the in-plane direction of the organic EL panel translucent substrate is in a range from 0 to 0.02, provided that the measurement wavelength is in a range from 380 to 780 nm

[Condition (E)]

At an angle in a range from 2 to 90° to the in-plane direction of the organic EL panel translucent substrate, in a case where the angle is the same, the Rip and the Rth in a wavelength range from 380 to 780 nm to the Rip and the Rth at a wavelength of 550 nm are respectively in a range from 90 to 120%.

(Supplementary Note 3)

An organic EL panel translucent substrate formed of a resin, wherein the substrate has refractive index anisotropy in at least one of its in-plane direction and thickness direction, and when the substrate is used for an organic EL panel, the whole organic EL panel becomes substantially optically isotropic in its in-plane direction and thickness direction.

(Supplementary Note 4)

The organic EL panel translucent substrate according to any one of supplementary notes 1 to 3, wherein the resin contains a polymer showing negative birefringence and a polymer showing positive birefringence.

(Supplementary Note 5)

The organic EL panel translucent substrate according to supplementary note 4 formed by lamination of a polymer film showing negative birefringence and a polymer film showing positive birefringence.

(Supplementary Note 6)

The organic EL panel translucent substrate according to supplementary note 4 or 5 formed by mixture of a polymer showing negative birefringence and a polymer showing positive birefringence.

(Supplementary Note 7)

The organic EL panel translucent substrate according to any one of supplementary notes 4 to 6 formed by random copolymerization of a polymer showing negative birefringence and a polymer showing positive birefringence.

(Supplementary Note 8)

The organic EL panel translucent substrate according to any one of supplementary notes 4 to 7 formed by block copolymerization of a polymer showing negative birefringence and a polymer showing positive birefringence.

(Supplementary Note 9)

The organic EL panel translucent substrate according to any one of supplementary notes 4 to 8 formed by graft copolymerization of a polymer showing negative birefringence and a polymer showing positive birefringence.

(Supplementary Note 10)

The organic EL panel translucent substrate according to any one of supplementary notes 1 to 9, wherein the substrate is a flexible translucent substrate.

(Supplementary Note 11)

The organic EL panel translucent substrate according to any one of supplementary notes 1 to 10, wherein the substrate is for an organic EL lighting panel.

(Supplementary Note 12)

The organic EL panel translucent substrate according to any one of supplementary notes 1 to 10, wherein the substrate is for an organic EL display panel.

(Supplementary Note 13)

A control method for refractive index anisotropy of an organic EL panel translucent substrate controlling refractive index anisotropy of the resin in an organic EL panel translucent substrate formed of a resin to control refractive index anisotropy in an in-plane direction and a thickness direction of the organic EL panel translucent substrate.

(Supplementary Note 14)

The method according to supplementary note 13, wherein the control is performed such that the organic EL panel translucent substrate becomes substantially optically isotropic in its in-plane direction and thickness direction.

(Supplementary Note 15)

The method according to supplementary note 14, wherein the control is performed such that the refractive index anisotropy in the in-plane direction and the refractive index anisotropy in the thickness direction of the organic EL panel translucent substrate satisfy at least one of the following conditions (A) to (E):

[Condition (A)]

With respect to light having a wavelength of 550 nm incident from a direction perpendicular to the in-plane direction of the organic EL panel translucent substrate, in-plane retardation Rip represented by the following equation (I) is 30 nm or less and thickness direction retardation Rth represented by the following equation (II) is 80 nm or less.

$$Rip=(nx-ny) \cdot d \quad (I)$$

$$Rth=\{(nx+ny)/2-nz\} \cdot d \quad (II)$$

In equations (I) and (II), nx, ny, and nz respectively represent refractive indices in an X-axis direction, a Y-axis direction, and a Z-axis direction in the organic EL panel translucent substrate. The X-axis direction is an axial direction in which the in-plane refractive index of the organic EL panel translucent substrate is the greatest, the Y-axis direction is an axial direction that is perpendicular to the X-axis direction in the plane, and the Z-axis direction is a thickness direction that is perpendicular to the X axis and the Y axis.

Furthermore, in equations (I) and (II), d represents a thickness (nm) of the organic EL panel translucent substrate.

[Condition (B)]

With respect to light having a wavelength of 550 nm incident from a direction at an angle of 45° to the in-plane direction of the organic EL panel translucent substrate, a numerical value (Rth/Rip) obtained by dividing the Rth represented by equation (II) by the Rip represented by equation (I) is 5.0 or less.

[Condition (C)]

With respect to light incident from a direction perpendicular to the in-plane direction of the organic EL panel translucent substrate, the in-plane retardation Rip represented by equation (I) in a wavelength range from 380 to 780 nm to the Rip at a wavelength of 550 nm is in a range from 95 to 110% (ratio is in a range from 0.95 to 1.10), and the thickness direction retardation Rth represented by equation (II) in a wavelength range from 380 to 780 nm to the Rth at a wavelength of 550 nm is in a range from 90 to 115% (ratio is in a range from 0.90 to 1.15).

[Condition (D)]

At the same measurement wavelength, a luminance at an angle in a range from 2 to 90° to the in-plane direction of the organic EL panel translucent substrate to a luminance at an angle of 90° to the in-plane direction of the organic EL panel translucent substrate is in a range from 85 to 110%, and a chromaticity change Δu′ v′ at an angle in a range from 2 to 90° to the in-plane direction of the organic EL panel translucent substrate is in a range from 0 to 0.02, provided that the measurement wavelength is in a range from 380 to 780 nm

[Condition (E)]

At an angle in a range from 2 to 90° to the in-plane direction of the organic EL panel translucent substrate, in a case where the angle is the same, the Rip and the Rth in a wavelength range from 380 to 780 nm to the Rip and the Rth at a wavelength of 550 nm are respectively in a range from 90 to 120%.

(Supplementary Note 16)

The method according to any one of supplementary notes 13 to 15, wherein the refractive index anisotropy in the in-plane direction and thickness direction of the organic EL panel translucent substrate is controlled by use of a polymer showing negative birefringence and a polymer showing positive birefringence as the resin.

(Supplementary Note 17)

The method according to supplementary note 16, wherein the refractive index anisotropy in the in-plane direction and thickness direction of the organic EL panel translucent substrate is controlled by lamination of a polymer film showing negative birefringence and a polymer film showing positive birefringence.

(Supplementary Note 18)

The method according to supplementary note 16 or 17, wherein the refractive index anisotropy in the in-plane direction and thickness direction of the organic EL panel translucent substrate is controlled by mixture of a polymer showing negative birefringence and a polymer showing positive birefringence.

(Supplementary Note 19)

The method according to any one of supplementary notes 16 to 18, wherein the refractive index anisotropy in the in-plane direction and thickness direction of the organic EL panel translucent substrate is controlled by random copolymerization of a polymer showing negative birefringence and a polymer showing positive birefringence.

(Supplementary Note 20)

The method according to any one of supplementary notes 16 to 19, wherein the refractive index anisotropy in the in-plane direction and thickness direction of the organic EL panel translucent substrate is controlled by block copolymerization of a polymer showing negative birefringence and a polymer showing positive birefringence.

(Supplementary Note 21)

The method according to any one of supplementary notes 16 to 20, wherein the refractive index anisotropy in the in-plane direction and thickness direction of the organic EL panel translucent substrate is controlled by graft copolymerization of a polymer showing negative birefringence and a polymer showing positive birefringence.

(Supplementary Note 22)

A manufacturing method for an organic EL panel translucent substrate, wherein refractive index anisotropy in an in-plane direction and a thickness direction of an organic EL panel translucent substrate is controlled by the method according to any one of supplementary notes 13 to 21.

(Supplementary Note 23)

An organic EL panel translucent substrate manufactured by the method according to supplementary note 22.

(Supplementary Note 24)

The organic EL panel translucent substrate according to supplementary note 23, wherein the substrate is for an organic EL lighting panel.

(Supplementary Note 25)

The organic EL panel translucent substrate according to supplementary note 23, wherein the substrate is for an organic EL display panel.

(Supplementary Note 26)

An organic EL panel comprising:
the organic EL panel translucent substrate according to any one of supplementary notes 1 to 12 and 23 to 25.

(Supplementary Note 27)

The organic EL panel according to supplementary note 26, wherein the panel is substantially optically isotropic in its in-plane direction and thickness direction.

(Supplementary Note 28)

The organic EL panel according to supplementary note 27 satisfying at least one of the following conditions (A') to (E'):

[Condition (A')]

With respect to light having a wavelength of 550 nm incident from a direction perpendicular to the in-plane direction of the organic EL panel, in-plane retardation Rip' represented by the following equation (I') is 30 nm or less and thickness direction retardation Rth' represented by the following equation (II') is 80 nm or less.

$$Rip'=(nx'-ny')\cdot d' \quad (I')$$

$$Rth'=\{(nx'+ny')/2-nz'\}\cdot d' \quad (II')$$

In equations (I') and (II'), nx', ny', and nz' respectively represent refractive indices in an X-axis direction, a Y-axis direction, and a Z-axis direction in the organic EL panel. The X-axis direction is an axial direction in which the in-plane refractive index of the organic EL panel is the greatest, the Y-axis direction is an axial direction that is perpendicular to the X-axis direction in the plane, and the Z-axis direction is a thickness direction that is perpendicular to the X axis and the Y axis.

Furthermore, in equations (I') and (II'), d' represents a thickness (nm) of the organic EL panel.

[Condition (B')]

With respect to light having a wavelength of 550 nm incident from a direction at an angle of 45° to the in-plane direction of the organic EL panel, a numerical value (Rth'/Rip') obtained by dividing the Rth' represented by equation (II') by the Rip' represented by equation (I') is 5.0 or less.

[Condition (C')]

With respect to light incident from a direction perpendicular to the in-plane direction of the organic EL panel, the in-plane retardation Rip' represented by equation (I') in a wavelength range from 380 to 780 nm to the Rip' at a wavelength of 550 nm is in a range from 95 to 110% (ratio is in a range from 0.95 to 1.10), and the thickness direction retardation Rth' represented by equation (II') in a wavelength range from 380 to 780 nm to the Rth' at a wavelength of 550 nm is in a range from 90 to 115% (ratio is in a range from 0.90 to 1.15).

[Condition (D')]

At the same measurement wavelength, a luminance at an angle in a range from 2 to 90° to the in-plane direction of the organic EL panel to a luminance at an angle of 90° to the in-plane direction of the organic EL panel is in a range from 85 to 110%, and a chromaticity change Δu' v' at an angle in a range from 2 to 90° to the in-plane direction of the organic EL panel is in a range from 0 to 0.02, provided that the measurement wavelength is in a range from 380 to 780 nm

[Condition (E')]

At an angle in a range from 2 to 90° to the in-plane direction of the organic EL panel, in a case where the angle is the same, a luminance/luminosity factor (a numerical value obtained by dividing a luminance by a luminosity factor) in a wavelength range from 380 to 780 nm to the luminance/luminosity factor at a wavelength of 550 nm is in a range from 85 to 110%.

(Supplementary Note 29)

The organic EL panel according to any one of supplementary notes 26 to 28 comprising the organic EL lighting panel translucent substrate according to supplementary note 11 or 24.

(Supplementary Note 30)

The organic EL panel according to any one of supplementary notes 26 to 28 comprising the organic EL display panel translucent substrate according to supplementary note 12 or 25.

(Supplementary Note 31)

An organic EL device comprising:

the organic EL panel translucent substrate according to any one of supplementary notes 1 to 12 and 23 to 25; or the organic EL panel according to any one of supplementary notes 26 to 30.

(Supplementary Note 32)

The organic EL device according to supplementary note 31 comprising the organic EL lighting panel translucent substrate according to supplementary note 11 or 24 or the organic EL lighting panel according to supplementary note 29.

(Supplementary Note 33)

The organic EL device according to supplementary note 31 comprising the organic EL display panel translucent substrate according to supplementary note 12 or 25 or the organic EL display panel according to supplementary note 30.

100 organic EL panel
101 organic EL panel translucent substrate
102 anode (transparent electrode)
103 hole injection layer
104 hole transport layer
105 light-emitting layer
106 electron transport layer
107 electron injection layer
108 cathode
109 sealing film
110 sealing part
201 translucent substrate
202 transparent resin film
203, 204 polymer molecule
205 frontward incident light
206, 207 diagonal incident light
205a frontward transmitted light
206a, 207a diagonally transmitted light
211, 212 refractive index ellipsoid of frontward transmitted light
221, 222 refractive index ellipsoid of diagonally transmitted light
213 refractive index ellipsoid obtained by synthesis of 211 and 212
223 refractive index ellipsoid obtained by synthesis of 221 and 222
301, 401, 501, 601, 701 organic EL panel translucent substrate
311, 321, 402, 502, 602, 702 resin film
312 positive birefringent polymer film
322 negative birefringent polymer film
313, 403, 503, 603, 703 positive birefringent polymer
323, 404, 504, 604, 704 negative birefringent polymer
1001 organic EL panel translucent substrate of the present invention
1002 organic EL panel translucent substrate having refractive index anisotropy (refractive index anisotropy is not controlled)
1101 organic EL panel translucent substrate
1102 resin film
1103 polymer
1205 frontward incident light
1206, 1207 diagonal incident light 1205a frontward transmitted light
1206a, 1207a diagonally transmitted light
1211 refractive index ellipsoid of frontward transmitted light
1221 refractive index ellipsoid of diagonally transmitted light

The invention claimed is:

1. An organic EL panel translucent substrate satisfying at least one of the following conditions (B) to (E):

(B)
   with respect to light having a wavelength of 550 nm incident from a direction at an angle of 45° to the in-plane direction of the organic EL panel translucent substrate, a numerical value (Rth/Rip) obtained by dividing the Rth represented by equation (II) by the Rip represented by equation (I) is 5.0 or less, where $$Rip=(nx-ny)\cdot d \quad (I)$$

$$Rth=\{(nx+ny)/2-nz\}\cdot d \quad (II)$$

where nx, ny, and nz respectively represent refractive indices in an X-axis direction, a Y-axis direction, and a Z-axis direction in the organic EL panel translucent substrate, the X-axis direction is an axial direction in which an in-plane refractive index is largest, the Y-axis direction is an axial direction that is perpendicular to the X-axis direction in the plane, and the Z-axis direction is a thickness direction that is perpendicular to the X axis and the Y axis, d represents a thickness (nm) of the organic EL panel translucent substrate;

(C)
   with respect to light incident from a direction perpendicular to the in-plane direction of the organic EL panel translucent substrate,
   the in-plane retardation Rip represented by equation (I) in a wavelength range from 380 to 780 nm to the Rip at a wavelength of 550 nm is in a range from 95 to 110%, and
   the thickness direction retardation Rth represented by equation (II) in a wavelength range from 380 to 780 nm to the Rth at a wavelength of 550 nm is in a range from 90 to 115%;

(D)
   at a measurement wavelength, a luminance at an angle in a range from 2 to 90° to the in-plane direction of the organic EL panel translucent substrate to a luminance at an angle of 90° to the in-plane direction of the organic EL panel translucent substrate is in a range from 85 to 110%, and
   a chromaticity change Δu'v' at an angle in a range from 2 to 90° to the in-plane direction of the organic EL panel translucent substrate is in a range from 0 to 0.02, provided that the measurement wavelength is in a range from 380 to 780 nm;

(E)
   at an angle in a range from 2 to 90° to the in-plane direction of the organic EL panel translucent substrate, in a case where the angle to the in-plane direction of the organic EL panel translucent substrate is the same, the Rip and the Rth in a wavelength range from 380 to 780 nm to the Rip and the Rth at a wavelength of 550 nm are respectively in a range from 90 to 120%.

2. The organic EL panel translucent substrate according to claim 1, wherein the substrate is a flexible translucent substrate.

3. The organic EL panel translucent substrate according to claim 1, wherein the substrate is for an organic EL lighting panel.

4. The organic EL panel translucent substrate according to claim 1, wherein the substrate is for an organic EL display panel.

5. An organic EL panel comprising:
   the organic EL panel translucent substrate according to claim 1.

6. The organic EL panel according to claim 5, wherein the panel is substantially optically isotropic in the in-plane direction and the thickness direction.

7. The organic EL panel according to claim 6 satisfying at least one of the following conditions (B') to (E'):

(B')
   with respect to light having a wavelength of 550 nm incident from a direction at an angle of 45° to the in-plane direction of the organic EL panel, a numerical value (Rth'/Rip') obtained by dividing the Rth' represented by equation (II') by the Rip' represented by equation (I') is 5.0 or less, where $$Rip'=(nx'-ny')\cdot d' \quad (I')$$

$$Rth'=\{(nx'+ny')/2-nz'\}\cdot d' \quad (II')$$

nx', ny', and nz' respectively represent refractive indices in an X-axis direction, a Y-axis direction, and a Z-axis direction in the organic EL panel, the X-axis direction is an axial direction in which the in-plane refractive index of the organic EL panel is the greatest, the Y-axis direction is an axial direction that is perpendicular to the X-axis direction in the plane, and the Z-axis direction is a thickness direction that is perpendicular to the X axis and the Y axis, d' represents a thickness (nm) of the organic EL panel;

(C')
   with respect to light incident from a direction perpendicular to the in-plane direction of the organic EL panel, the in-plane retardation Rip' represented by equation (I') in a wavelength range from 380 to 780 nm to the Rip' at a wavelength of 550 nm is in a range from 95 to 110%, and
   the thickness direction retardation Rth' represented by equation (II') in a wavelength range from 380 to 780 nm to the Rth' at a wavelength of 550 nm is in a range from 90 to 115%;

(D')
   at a measurement wavelength, a luminance at an angle in a range from 2 to 90° to the in-plane direction of the organic EL panel to a luminance at an angle of 90° to the in-plane direction of the organic EL panel is in a range from 85 to 110%, and
   a chromaticity change at an angle in a range from 2 to 90° to the in-plane direction of the organic EL panel is in a range from 0 to 0.02, provided that the measurement wavelength is in a range from 380 to 780 nm;

(E')
   at an angle in a range from 2 to 90° to the in-plane direction of the organic EL panel, in a case where the angle to the in-plane direction of the organic EL panel translucent substrate is the same, a luminance/luminosity factor (a numerical value obtained by dividing a luminance by a luminosity factor) in a wavelength range from 380 to 780 nm to the luminance/luminosity factor at a wavelength of 550 nm is in a range from 85 to 110%.

8. An organic EL device comprising:
the organic EL panel according to claim 5.

9. An organic EL panel translucent substrate formed of a resin, wherein
the substrate is substantially optically isotropic in an in-plane direction and a thickness direction, and
wherein the resin contains a polymer showing negative birefringence and a polymer showing positive birefringence.

10. The organic EL panel translucent substrate according to claim 9 formed by at least one of the following methods (1) to (5):
(1) lamination of a polymer film showing negative birefringence and a polymer film showing positive birefringence;
(2) mixture of a polymer showing negative birefringence and a polymer showing positive birefringence;
(3) random copolymerization of a polymer showing negative birefringence and a polymer showing positive birefringence;
(4) block copolymerization of a polymer showing negative birefringence and a polymer showing positive birefringence; and
(5) graft copolymerization of a polymer showing negative birefringence and a polymer showing positive birefringence.

11. An organic EL device comprising:
the organic EL panel translucent substrate according to claim 9.

12. The organic EL panel translucent substrate according to claim 9, wherein the substrate is a flexible translucent substrate.

13. The organic EL panel translucent substrate according to claim 9, wherein the substrate is for an organic EL lighting panel.

14. The organic EL panel translucent substrate according to claim 9, wherein the substrate is for an organic EL display panel.

15. A control method for refractive index anisotropy of an organic EL panel translucent substrate, comprising:
controlling refractive index anisotropy of a resin in an organic EL panel translucent substrate formed of the resin to control refractive index anisotropy in an in-plane direction and a thickness direction of the organic EL panel translucent substrate,
wherein the control is performed such that the organic EL panel translucent substrate becomes substantially optically isotropic in its in-plane direction and thickness direction.

16. A manufacturing method for an organic EL panel translucent substrate, wherein refractive index anisotropy in an in-plane direction and a thickness direction of an organic EL panel translucent substrate is controlled by the method according to claim 15.

17. An organic EL panel translucent substrate manufactured by the method according to claim 16.

18. A control method for refractive index anisotropy of an organic EL panel translucent substrate, comprising:
controlling refractive index anisotropy of a resin in an organic EL panel translucent substrate formed of the resin to control refractive index anisotropy in an in-plane direction and a thickness direction of the organic EL panel translucent substrate,
wherein the control is performed such that the organic EL panel translucent substrate becomes substantially optically isotropic in its in-plane direction and thickness direction, and wherein the control is performed such that the refractive index anisotropy in the in-plane direction and the refractive index anisotropy in the thickness direction of the organic EL panel translucent substrate satisfy at least one of the following conditions (A) to (E):

(A)
with respect to light having a wavelength of 550 nm incident from a direction perpendicular to an in-plane direction of the organic EL panel translucent substrate, in-plane retardation Rip represented by equation (I) is 30 nm or less and thickness direction retardation Rth represented by equation (II) is 80 nm or less $$Rip=(nx-ny)\cdot d \quad (I)$$

$$Rth=\{(nx+ny)/2-nz\}\cdot d \quad (II)$$

where nx, ny, and nz respectively represent refractive indices in an X-axis direction, a Y-axis direction, and a Z-axis direction in the organic EL panel translucent substrate, the X-axis direction is an axial direction in which an in-plane refractive index is largest, the Y-axis direction is an axial direction that is perpendicular to the X-axis direction in the plane, and the Z-axis direction is a thickness direction that is perpendicular to the X axis and the Y axis,
d represents a thickness (nm) of the organic EL panel translucent substrate;

(B)
with respect to light having a wavelength of 550 nm incident from a direction at an angle of 45° to the in-plane direction of the organic EL panel translucent substrate, a numerical value (Rth/Rip) obtained by dividing the Rth represented by equation (II) by the Rip represented by equation (I) is 5.0 or less;

(C)
with respect to light incident from a direction perpendicular to the in-plane direction of the organic EL panel translucent substrate,
the in-plane retardation Rip represented by equation (I) in a wavelength range from 380 to 780 nm to the Rip at a wavelength of 550 nm is in a range from 95 to 110%, and
the thickness direction retardation Rth represented by equation (II) in a wavelength range from 380 to 780 nm to the Rth at a wavelength of 550 nm is in a range from 90 to 115%;

(D)
at a measurement wavelength, a luminance at an angle in a range from 2 to 90° to the in-plane direction of the organic EL panel translucent substrate to a luminance at an angle of 90° to the in-plane direction of the organic EL panel translucent substrate is in a range from 85 to 110%, and
a chromaticity change Δu'v' at an angle in a range from 2 to 90° to the in-plane direction of the organic EL panel translucent substrate is in a range from 0 to 0.02, provided that the measurement wavelength is in a range from 380 to 780 nm;

(E)
at an angle in a range from 2 to 90° to the in-plane direction of the organic EL panel translucent substrate,
in a case where the angle to the in-plane direction of the organic EL panel translucent substrate is the same, the Rip and the Rth in a wavelength range from 380 to 780 nm to the Rip and the Rth at a wavelength of 550 nm are respectively in a range from 90 to 120%.

19. A control method for refractive index anisotropy of an organic EL panel translucent substrate, comprising:
  controlling refractive index anisotropy of a resin in an organic EL panel translucent substrate formed of the resin to control refractive index anisotropy in an in-plane direction and a thickness direction of the organic EL panel translucent substrate, wherein
  the refractive index anisotropy in the in-plane direction and thickness direction of the organic EL panel translucent substrate is controlled by use of a polymer showing negative birefringence and a polymer showing positive birefringence as the resin.

20. The method according to claim 19, wherein the refractive index anisotropy in the in-plane direction and thickness direction of the organic EL panel translucent substrate is controlled by at least one of the following methods (1) to (5):
  (1) lamination of a polymer film showing negative birefringence and a polymer film showing positive birefringence;
  (2) mixture of a polymer showing negative birefringence and a polymer showing positive birefringence;
  (3) random copolymerization of a polymer showing negative birefringence and a polymer showing positive birefringence;
  (4) block copolymerization of a polymer showing negative birefringence and a polymer showing positive birefringence; and
  (5) graft copolymerization of a polymer showing negative birefringence and a polymer showing positive birefringence.

21. A manufacturing method for an organic EL panel translucent substrate, wherein refractive index anisotropy in an in-plane direction and a thickness direction of an organic EL panel translucent substrate is controlled by the method according to claim 19.

* * * * *